US006891168B2

(12) United States Patent
Knippelmeyer

(10) Patent No.: US 6,891,168 B2
(45) Date of Patent: May 10, 2005

(54) PARTICLE-OPTICAL APPARATUS AND METHOD FOR OPERATING THE SAME

(75) Inventor: Rainer Knippelmeyer, Aalen (DE)

(73) Assignee: Carl Zeiss NTS GmbH (DE)

(*) Notice: Subject to any disclaimer, the term of this patent is extended or adjusted under 35 U.S.C. 154(b) by 0 days.

(21) Appl. No.: 10/639,741

(22) Filed: Aug. 13, 2003

(65) Prior Publication Data

US 2004/0113092 A1 Jun. 17, 2004

(30) Foreign Application Priority Data

Aug. 13, 2002 (DE) .......................................... 102 37 135

(51) Int. Cl.⁷ .......................................... H01J 37/147
(52) U.S. Cl. .................................................. 250/396 R
(58) Field of Search .............................. 250/396 R, 310

(56) References Cited

U.S. PATENT DOCUMENTS

| | | | | | |
|---|---|---|---|---|---|
| 6,051,839 | A | * | 4/2000 | Crewe ................. | 250/396 ML |
| 6,633,366 | B2 | * | 10/2003 | de Jager et al. .............. | 355/67 |
| 2003/0066961 | A1 | | 4/2003 | Kienzle et al. | |
| 2004/0056193 | A1 | | 3/2004 | Kienzle et al. | |

FOREIGN PATENT DOCUMENTS

| | | |
|---|---|---|
| DE | 101 61 680 A1 | 6/2003 |
| EP | 1 182 684 A2 | 2/2002 |
| WO | WO 01/22469 A1 | 3/2001 |

OTHER PUBLICATIONS

Peter Schmid et al., "Outline of a variable–axis lens with arbitrary shift of axis in one direction," J. Vac. Sci. Technol. B, vol. 19, No. 6., Nov./Dec. 2001, pp 2555–2565, American Vacuum Society.

* cited by examiner

Primary Examiner—Kiet T. Nguyen
(74) Attorney, Agent, or Firm—Jones Day

(57) ABSTRACT

An apparatus and a method to manipulate at least one beam of charged particles are provided. The apparatus comprises two rows of field source members 13 which are disposed periodically at a distance from each other such that there exist planes of symmetry S, S' with respect to which the field source members 13 are symmetrically disposed. The field has a component which is displaceable in the x-direction. To provide such field, a pattern of source strengths according to the formula $F_1(x)=F_m(x)+F_c(x)$ is applied to the field source members, wherein $F_m$ is a component which is substantially independent of the displacement $x_0$ and $F_c$ is a correction component which is dependent on $x_0$.

30 Claims, 13 Drawing Sheets

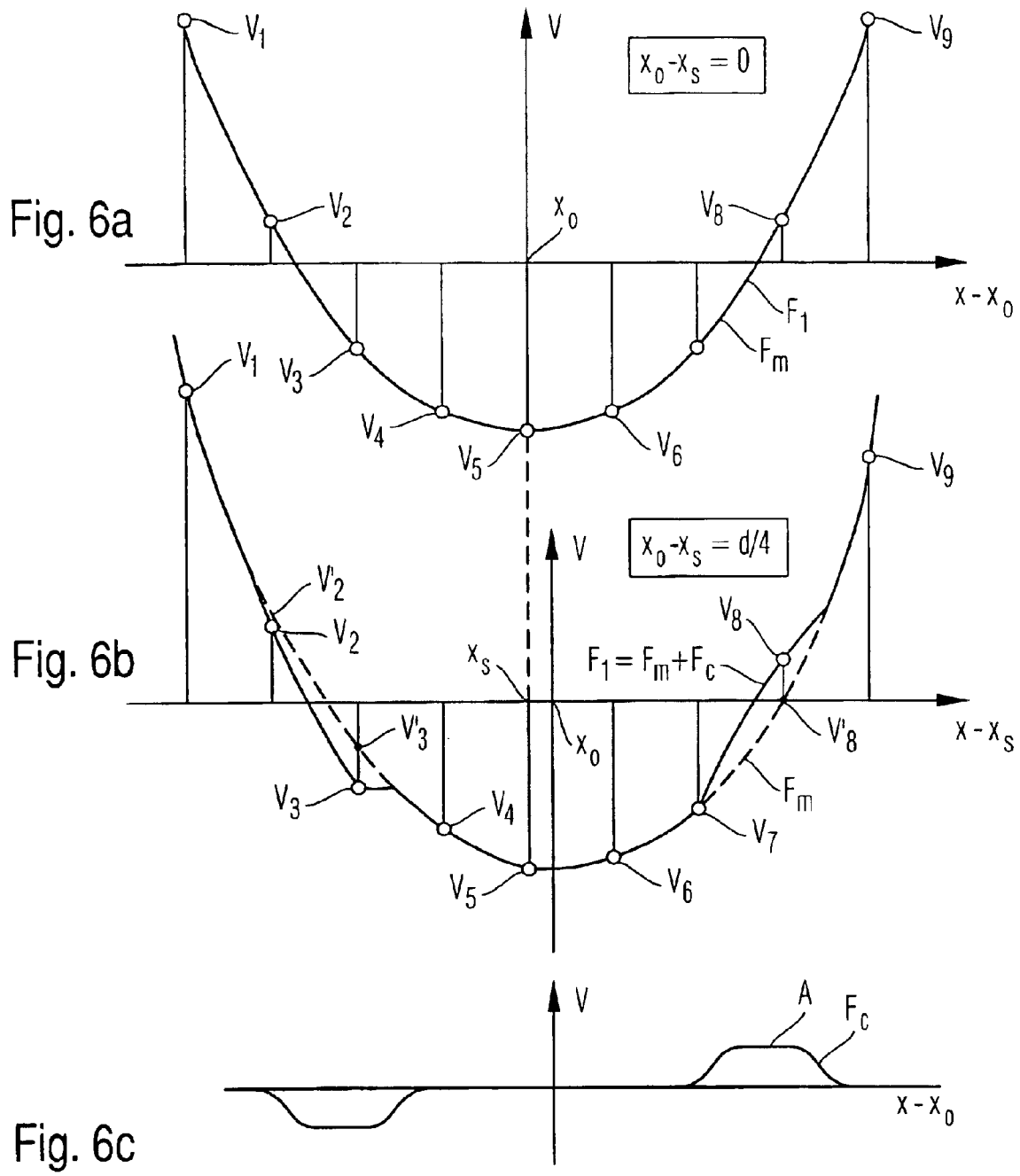
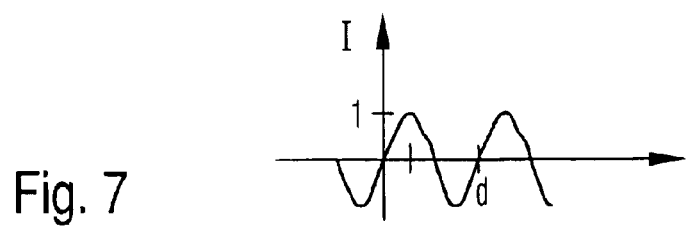

PARTICLE-OPTICAL APPARATUS AND METHOD FOR OPERATING THE SAME

This application is based upon DE 102 37 135.0 filed on Aug. 13, 2002, the entire contents of which are incorporated herein by reference.

BACKGROUND OF THE INVENTION

1. Field of the Invention

The invention relates to a particle-optical apparatus and a method for operating the same.

The particle-optical apparatus is provided to manipulate a beam of charged particles. The manipulation may comprise guiding and shaping of the beam, and, in particular, deflecting or/and focusing or defocusing the beam at least in one plane.

In particular, the invention also relates to a microscopy system and a lithography system which use of beams of charged particles, such as electron beams for imaging structures.

2. Brief Description of Related Art

From WO 01/22469 A1 there is known a particle-optical apparatus which has an effect of a focusing round lens on a beam of charged particles, wherein an optical axis of the round lens is displaceable transversely to a direction of the beam. To this end, the apparatus comprises two parallel rows of field source members which are spaced apart from each other. The field source members are in each row periodically spaced from each other in a row direction. Source strengths of the field source members are adjusted such that a quadrupole field is provided between the two rows of field source members to manipulate the beam. This quadrupole field cooperates with a field of cylinder lenses provided by slit shaped apertures such that the particle beam is focused with respect to an optical axis which is defined by a position of the quadrupole field in the row direction. By displacing the quadrupole field in the row direction, it is possible to displace the optical axis of the focusing effect also in the row direction.

The optical properties of this conventional particle-optical apparatus have been found to be insufficient.

SUMMARY OF THE INVENTION

Accordingly, it is an object of the present invention to provide a particle-optical apparatus and a method for operating the same such that enhanced particle-optical properties may be achieved.

According to one aspect, the invention provides a method in which to manipulate a beam of charged particles, in which source strengths of the field source members are represented by a pattern or a position-dependent function, and in which the pattern and the position-dependent function, respectively, are displaced in the row direction for displacing the beam-manipulating effect in the row direction.

The inventors have found that the influence on the beam provided by the fields after displacement will be particularly coincident with the influence on the beam prior to displacement, if displacement is by an amount of an integer multiple of an arrangement period of the field source members in the row direction. If the displacements deviate from these integer multiples of the arrangement periods, deviations between the effect of the non-displaced field and the effect of the displaced field will result due to the discretization resulting from the limited number of field source members. The invention then further provides to set the source strengths not only in dependence on the displaced pattern and displaced position-dependent function, respectively, but to further incorporate correction terms in determination of the source strengths. These correction terms will be substantially zero, when the displacement is an integer multiple of the arrangement period of the field source members in the row, and corrections will be different from zero, when the displacement is different from an integer multiple of the arrangement period.

According to a further aspect, the invention provides a particle-optical apparatus of the type discussed above, wherein a corresponding region is provided between the two rows of field source members for each beam of charged particles, wherein the field source members generate in each field region a separate field to manipulate a respective beam.

The inventors have found here that those field regions which are disposed in a row of field regions between adjacent field regions provide optical properties for the beams passing through said regions which are particularly reproducible and independent of a displacement. Field regions, however, which are disposed at an end of such a row provided optical properties which change in dependence of a displacement of the field regions in the row direction of the row of field regions.

According to this aspect, the invention therefore provides an additional field region next to a field region, which is at the end of a row of field regions for manipulating a row of beams, although such additional field region is not required for manipulating a beam. This additional field region provides a field similar to that of the field regions within the row, so that the field region originally disposed at the end of the row of field regions is now disposed in a surrounding field configuration which is similar to that of the field regions which are not disposed at the end of the row of field regions. Hence, all beams of the row are manipulated by respective field configurations which are substantially identical to each other.

In embodiments in the present application, one field region is associated with one beam. The field region provides for a manipulation of the one beam a field of a steady field geometry, such as a quadrupole geometry. However, the invention also encompasses to provide such field region for manipulating a group of beams, such as illustrated in co-pending U.S. patent application Ser. No. 10/619,690 filed on Jul. 16, 2003 entitled APPLICATIONS OPERATING WITH BEAMS OF CHARGED PARTICLES of the same assignee, for example with reference to FIG. 6 thereof. The entire contents of U.S. patent application Ser. No. 10/619,690 filed on Jul. 16, 2003 entitled APPLICATIONS OPERATING WITH BEAMS OF CHARGED PARTICLES are incorporated herein by reference.

In an aspect of the invention, there is provided a method for operating a particle-optical apparatus to manipulate at least one beam of charged particles, the apparatus comprising at least one row of field source members extending in a row direction, the field source members being disposed periodically in the row direction and at a distance from each other such that there exists at least one set of symmetry planes such that the field source members of the row are disposed symmetrically with respect to each of the symmetry planes. The method comprises setting source strengths of the field source members to generate a field for manipulating the beam such that a field intensity distribution of the field in a region of the field comprises a first intensity component and a second intensity component, wherein the first intensity component is displaceable in the row direction and the second intensity component is substantially independent of a displacement of the first intensity component, wherein the source strengths of the field source members are substantially representable according to a formula $$U_i = F_m(x_i - x_0) + F_2(x_i)$$

wherein $U_i$ is the source strength of an $i^{th}$ field source member, $x_i$ represents a position of the $i^{th}$ field source member in the row direction, $x_0$ represents the displacement of the first intensity component, $F_m(x)$ is a function representing the first intensity component, and $F_2(x)$ is a function representing the second intensity component.

The source strengths of the field source members are further representable by at least one correction term applied to the formula (1), said correction term having an amount which increases in an interval of $|x_0-x_s|$ as $|x_0-x_s|$ increases from zero, wherein $x_s$ represents a position in the row direction of that symmetry plane of the at least one set of symmetry planes which is closest to the position $x_0$. In this aspect, substantially representable means that the source strengths are generated in a manner that can be represented by the functional attributes of the formula above, but this does not preclude the possibility of including additional functional attributes to the formula.

In addition, the source strengths of the field source members may be represented generally herein by $U_i$ and can be, for example, voltages that may be referred to herein by $V_i$. The source strengths can also be, for example, those of magnetic sources.

In another aspect of the invention there is provided a method for operating a particle-optical apparatus to manipulate at least one beam of charged particles, the apparatus comprising at least one row of field source members extending in a row direction, the field source members being disposed periodically in the row direction and at a distance from each other such that there exists at least one set of symmetry planes such that the field source members of the row are disposed symmetrically with respect to each of the symmetry planes, the apparatus comprising a beam guiding arrangement for directing the beam of charged particles at a predetermined angle with respect to the row direction to the field at a beam location, or for accepting the beam of charged particles when it emerges at a predetermined angle from the beam location. The method comprises setting source strengths of the field source members to generate a field for manipulating the beam such that a field intensity distribution of the field in a region of the field comprises a first intensity component and a second intensity component, wherein the first intensity component is displaceable in the row direction and the second intensity component is substantially independent of a displacement of the first intensity component. The source strengths of the field source members are determined according to a formula $$U_i = F_m(x_1 - x_0) + F_2(x_i)$$

wherein $U_i$ is the source strength of an $i^{th}$ field source member, $x_i$ represents a position of the $i^{th}$ field source member in the row direction, $x_0$ represents the displacement of the first intensity component, $F_m(x)$ is a function representing the first intensity component, and $F_2(x)$ is a function representing the second intensity component.

The beam guiding arrangement changes the predetermined angle by a correction term having an amount which increases in an interval of $|x_0-x_s|$ as $|x_0-x_s|$ increases from zero, wherein $x_s$ represents a position in the row direction of that symmetry plane of the at least one set of symmetry planes which is closest to the position $x_0$.

In another aspect of the invention, there is provided a particle-optical apparatus for manipulating at least one beam of charged particles. The apparatus comprises at least one row of field source members extending in a row direction, the field source members being disposed periodically in the row direction and at a distance from each other such that there exists at least one set of symmetry planes such that the field source members of the row are disposed symmetrically with respect to each of the symmetry planes. The apparatus further comprises a controller for setting source strengths of the field source members to generate a field for manipulating the beam such that a field intensity distribution of the field in a region of the field comprises a first intensity component and a second intensity component, wherein the first intensity component is displaceable in the row direction and the second intensity component is substantially independent of a displacement of the first intensity component. The controller is configured to set the source strengths of the field source members according to a formula $$U_i = F_1(x_i - x_0) + F_2(x_i)$$

wherein $U_i$ is the source strength of an $i^{th}$ field source member, $x_i$ represents a position of the $i^{th}$ field source member in the row direction, $x_0$ represents the displacement of the first intensity component, $F_1(x)$ is a function representing the first intensity component, and $F_2(x)$ is a function representing the second intensity component.

$F_1(x)$ is given in a region around $x_0$ by $$F_1(x) = F_m(x) + F_c(x)$$

wherein $F_m(x)$ represents a main component which is substantially independent of $x_0$, and $F_c(x)$ represents a correction component which is dependent on $x_0$, and wherein $F_c(x)$ substantially satisfies the equation $$F_c(x) \cong I_a(x_0 - x_s) \cdot A(x) + I_s(x_0 - x_s) \cdot S(x)$$

in an interval of $|x_0-x_s|$ as $|x_0-x_s|$ increases from zero, wherein $x_s$ represents a position in the row direction of that symmetry plane of the at least one set of symmetry planes which is closest to the position $x_0$, $S(x)$ is a function which is substantially independent of $x_0$ and symmetric in x, $A(x)$ is a function which is substantially independent of $x_0$ and anti-symmetrical in x, $I_s(x)$ is an arbitrary function, and $I_a(x)$ is a function which is zero at $x \cong 0$.

In this aspect, δ may be small in comparison with the distance of adjacent field source members in the row direction, e.g., δ may be close to zero.

In another aspect of the invention, there is provided a method for operating a particle-optical apparatus to manipulate at least one group of at least one beam of charged particles, wherein the at least one beam of charged particles is incident on the apparatus, the apparatus comprising at least one row of field source members extending in a row direction, the field source members being disposed periodically in the row direction and at a distance from each other. The method comprises setting source strengths of the field source members to generate a field for manipulating the at least one beam of charged particles, wherein a separate field region is provided for each group of the at least one beam of charged particles and wherein a number of the field regions is equal to a number of groups of the at least one beam of charged particles. An additional field region is provided at at least one end of a row of said field regions, wherein a field in the additional field region is substantially symmetric to the field at the end of the row of field regions, or an intensity of the field in the additional field region changes along the row direction substantially according to a same function as fields in the row of said field regions.

In another aspect of the invention, there is provided a particle-optical apparatus for manipulating at least one group of at least one beam of charged particles, the at least one beam of charged particles being incident on the apparatus. The apparatus comprises at least one row of field source members extending in a row direction, the field source members being disposed periodically in the row direction and at a distance from each other. The apparatus further comprises a controller which is adapted for setting source strengths of the field source members to generate at least one field region for manipulating the at least one beam of charged particles, wherein the controller is further adapted for setting the source strengths of the field source members to generate an additional field region at at least one end of a row of field regions, wherein a field in the additional field region is substantially symmetric to a field at the end of the row of field regions, or an intensity of the field in the additional field region changes along the row direction substantially according to a same function as fields in the row of field regions.

According to the invention, the particle-optical apparatus can be used in a lithographic system or/and a microscopy system.

BRIEF DESCRIPTION OF THE DRAWINGS

The forgoing as well as other advantageous features of the invention will be more apparent from the following detailed description of exemplary embodiments of the invention with reference to the accompanying drawings, wherein:

FIGS. 6a, 6b and 6c illustrate main components and correction components of voltages to be applied to finger electrodes for generating a quadrupole field in the comb lens shown in FIGS. 1–3;

FIG. 7 is a graphical representation of an auxiliary function for determining correction components of FIG. 6;

DETAILED DESCRIPTION OF EXEMPLARY EMBODIMENTS

Figure 1:
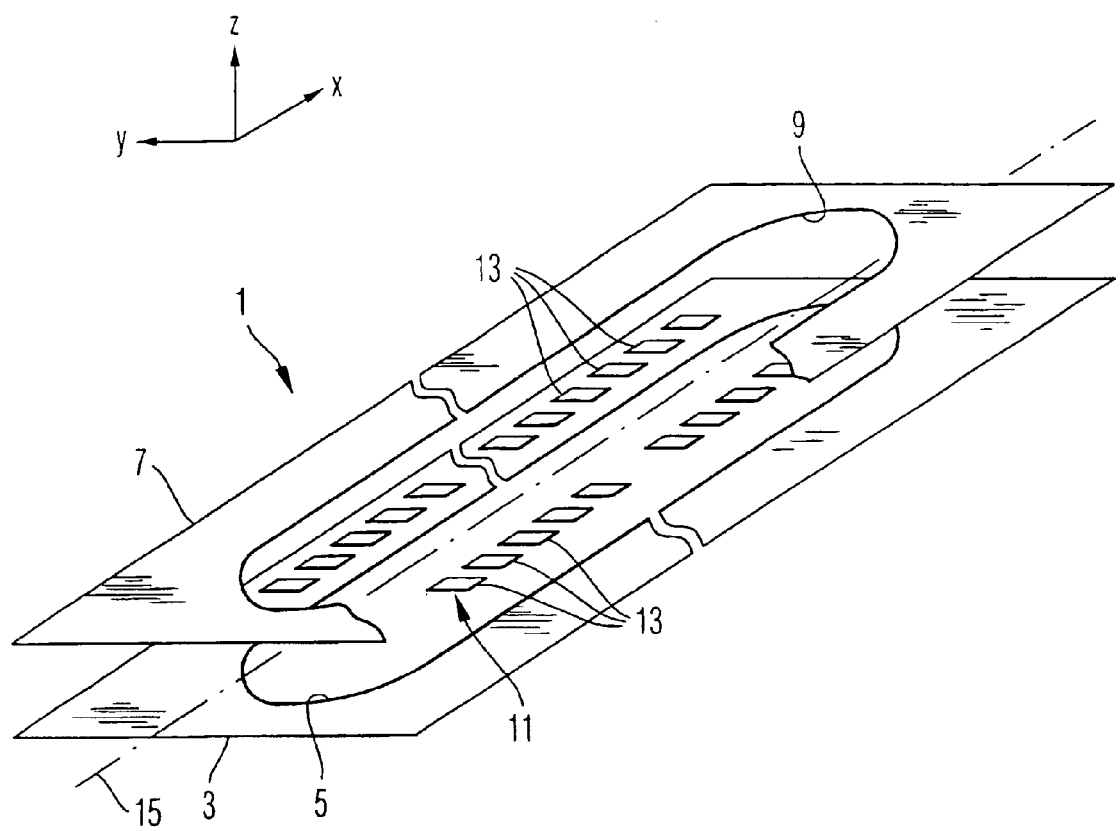
FIG. 1 shows a perspective representation of an electrostatic comb lens.

In the embodiments described below, components which are identical in function and structure are designated as far as possible by the same reference numerals. Therefore, to understand the features of the individual components of a specific embodiment, the descriptions of other embodiments should be referred to.

A particle-optical apparatus 1, referred to as a comb lens, for use in an apparatus and method according to the invention is schematically shown in FIG. 1.

The comb lens comprises three electrode arrangements superimposed in the z-direction, namely a slit electrode 3 right at the bottom having an aperture 5 elongated in the x-direction, a slit electrode 7 in the z-direction at the top having an aperture 9 likewise elongated in the x-direction, as well as a comb electrode 11 disposed between said two slit electrodes 3 and 7. The comb electrode 11 comprises two rows of source members of electric fields, namely finger electrodes 13 which are disposed on both sides of a central longitudinal axis 15 of the comb electrode 11 extending in the x-direction. The two rows of finger electrodes 13 thus delimit in the y-direction a space above and below the apertures 5 and 9, respectively, so that said space can likewise be considered as an aperture of the comb electrode 11. References to x-direction, y-direction, z-direction, etc., herein are merely for convenience and should not be considered as limiting the scope of the present invention in any way.

Electric potentials are supplied to the two slit electrodes 3 and 7 as well as to the finger electrodes 13 by a controller, not shown in FIG. 1, so that adjustable electric fields can be generated between the electrodes 3, 7 and 13. These fields act on a beam of electrically charged particles which is oriented transversely to the xy-plane and traverses the apertures of the electrode arrangements 7, 11 and 5. If an electric potential is applied to the slit electrodes 3 or 7 which is different from the potential of the beam of charged particles in the plane of the slit electrodes 3, 7 the effect of the slit electrodes 3 and 7, respectively, applied to the beam is that of a cylinder lens. A configuration of the electric field lines as it is generated by such slit electrode 3, 7 is schematically shown in FIG. 2a.

A potential pattern can be applied to the finger electrodes 13 of the comb electrode arrangement 11 such that a quadrupole-like electric field is generated in the opening of the comb electrode 11. A configuration of field lines of such quadrupole field is schematically shown in FIG. 2b, the field having an axis of symmetry 17 which extends in the z-direction and intersects the longitudinal axis 15 of the comb electrode 11.

A beam of electrically negatively charged particles which traverses the quadrupole field is focused in the x-direction and defocused in the y-direction.

Figure 2A:
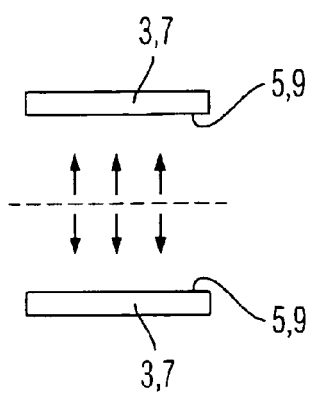
FIGS. 2a, 2b and 2c are schematic representations of field configurations for illustrating a function of the comb lens shown in FIG. 1.
Figure 2B:
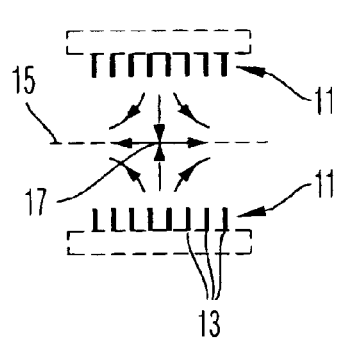
Figure 2C:
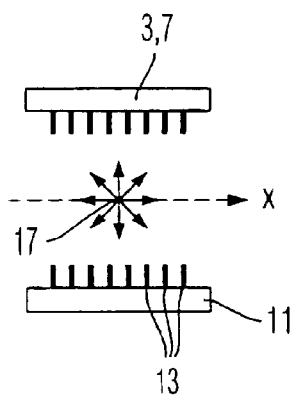

Thus, when a beam traverses the apparatus 1 along the axis of symmetry 17 of the quadrupole field, it is subjected as a whole to the effects of the cylinder lens fields provided by the slit electrodes 3 and 7 according to FIG. 2a as well as the quadrupole field provided by the comb electrode 11 according to FIG. 2b. The beam is thus subjected to a superposition of the field configurations shown in FIGS. 2a and 2b. When the strengths of the cylinder lens fields and the quadrupole field are appropriately adjusted to each other, the effect applied on the beam is the same as that applied by a round lens field, field lines of which are schematically shown in FIG. 2c.

It is thus possible to focus a beam of charged particles by means of the comb lens arrangement 1, if an appropriate potential is applied to the electrodes 3, 7 and 13.

Figure 3:
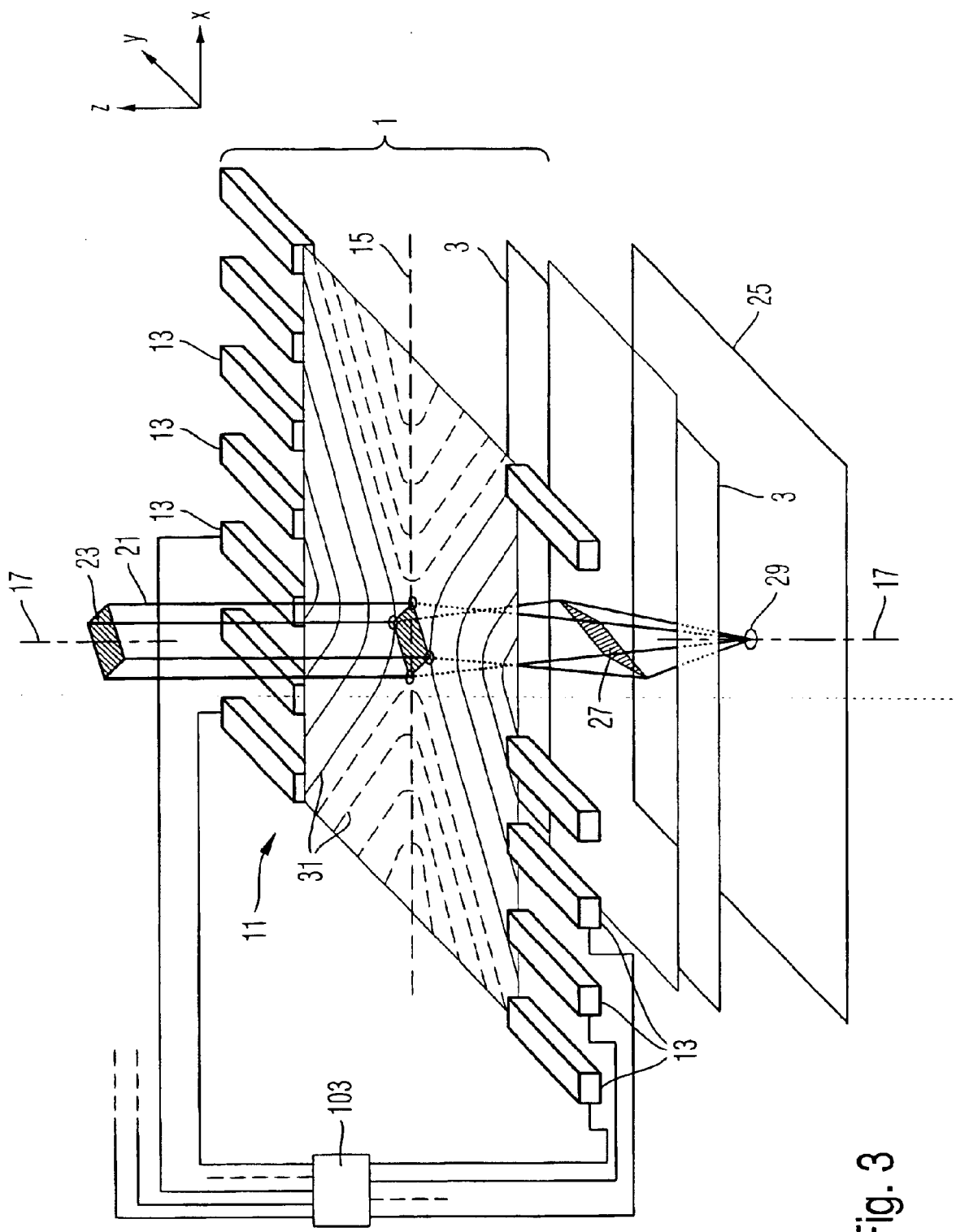
FIG. 3 is an illustration of a focusing function of the comb lens of FIG. 1.

This is again shown in perspective view in FIG. 3. A beam 21 of charged particles of a rectangular cross-section 23 enters a comb lens arrangement 1 along an axis of symmetry 17 and in the z-direction. The comb lens arrangement comprises a comb electrode 11 having two rows of finger electrodes 13, and a slit electrode 3 therebelow. Below the slit electrode 3, there is disposed an object plane 25 in which the beam 21 is to be focussed.

A controller 103 applies such voltage pattern to the finger electrode 13 that an electric quadrupole field is generated in the aperture between the rows of finger electrodes 13. A configuration of the quadrupole field is indicated in FIG. 3 by lines 31 of constant electric potential. The quadrupole field focuses the beam 21 in the x-direction and defocuses the same in the y-direction. Accordingly, having traversed the comb electrode 11, the beam assumes in the plane of the slit electrode 3 a cross-sectional shape of a rhombus 27 which is elongated in the y-direction. The slit electrode 3, however, acts on the beam 21 like a cylinder lens which focuses the beam 21 in the y-direction so that it is focused in the object plane 25 on a small spot 29.

In FIG. 1, two slit electrodes 3 and 7 are respectively provided for generating the cylinder lens field whereas, in FIG. 3, merely one slit electrode 3 is provided for generating the cylinder lens field. It is further possible to generate the cylinder lens field by the comb electrode 13, when an average potential of the comb electrode is set to a value which differs from the potential of the beam 21 in the plane of the comb electrode. Accordingly, on the average, the finger electrodes 13 generate the cylinder lens field, and the respective quadrupole field is generated by position-dependent deviations from the average of the potentials of the finger electrodes 13.

Figure 4:
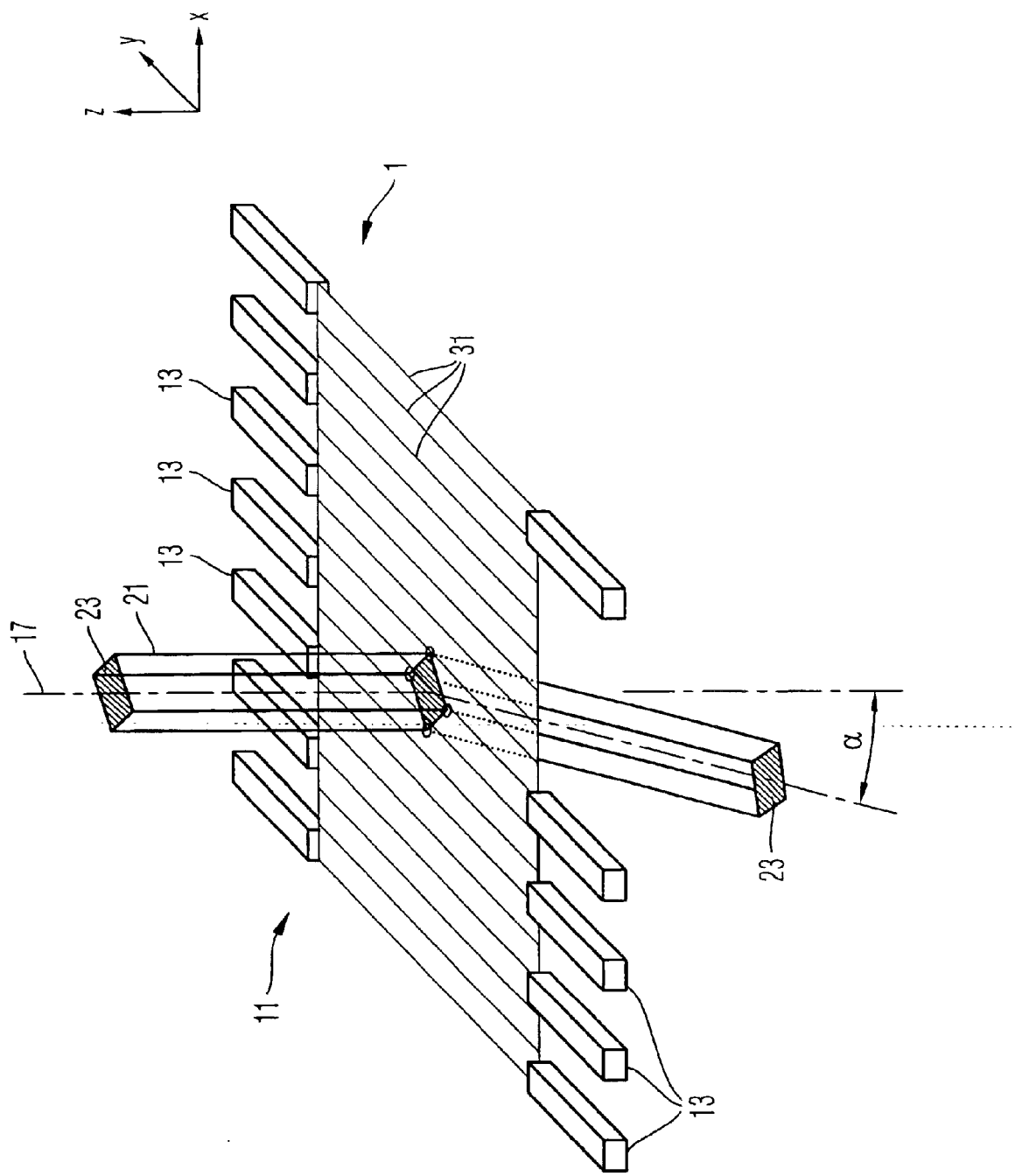
FIG. 4 is an illustration of a deflecting function of the comb lens of FIG. 1.

FIG. 4 shows an operating mode of comb lens 11 which differs from the operating mode shown in FIG. 3 used for focusing the beam of charged particles. In FIG. 4, potentials are applied to the finger electrodes 13 by a controller, not shown in FIG. 4, such that a substantially homogenous electric field oriented in the x-direction is generated in an aperture formed between the two rows of finger electrodes 13. Potential lines 31 of the electric field are schematically illustrated in FIG. 4. The beam 21 of charged particles of rectangular cross-section 23 which enters the comb electrode 11 along a beam axis 17 oriented in the z-direction is deflected in the x-direction by an angle α by the substantially homogenous electric field generated in the aperture between the two rows of finger electrodes 13, wherein the cross-section 23 of the beam remains substantially unchanged.

Consequently, it is possible to use the comb electrode 11 as a beam deflector. In particular, the field which deflects the beam 21 can be provided only locally in a region traversed by the beam 21, i.e., the electric field need not extend over the entire length of the comb electrode 11 in the x-direction.

Furthermore, it is possible to combine the operating modes of FIGS. 3 and 4 in that potentials are applied to the finger electrodes 13 such that a superposition of the quadrupole field according to FIG. 3 and the homogenous field according to FIG. 4 is provided in the aperture between the rows of electrodes. A so controlled comb electrode then has the effect of a focusing beam deflector.

In the above-described FIGS. 1 to 4, the finger electrodes 13 each act as source members for an electric field generated by the comb electrode 11 for manipulating the particle beam 21.

Figure 5:
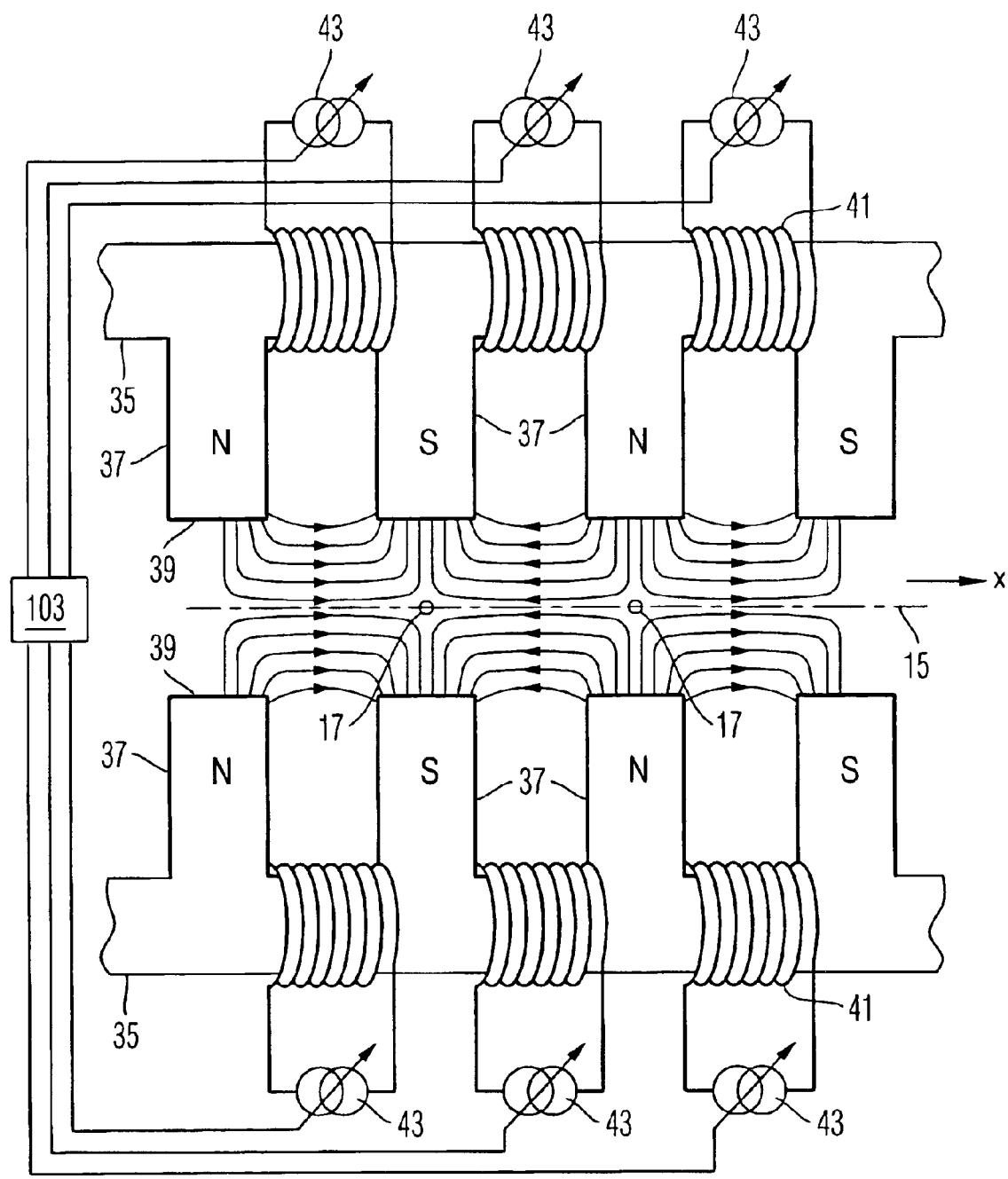
FIG. 5 is a schematic illustration of a magnetic comb lens.

Alternatively, it is also possible to generate magnetic fields in an opening of a comb arrangement for manipulating the particle beam. An embodiment of such comb arrangement is schematically shown in FIG. 5. The comb arrangement 11 shown there comprises two parallel rods 35 extending on both sides of a central axis 15 in the x-direction, and a row of fingers 37 project from each rod in a direction towards the central axis 15. The fingers 37 are spaced apart from one another and each have a front face 39 directed towards the central axis 15. Between two adjacent fingers 37, a winding 41 of electrically conductive wire is wound around the rods 35. In order to supply electric current to each one of the windings, a current source 43 is provided for each winding which is controlled by a controller, not shown in FIG. 5, in order to supply each winding 41 with an adjustable current. The current conductor windings 41 then generate magnetic fields which, among others, are carried by the rod 35 and the fingers 37. In FIG. 5, a current pattern is applied to the windings 41 such that adjacent windings 41 each produce magnetic fields of opposed orientation. As a result, a magnetic field configuration is generated in an aperture of the comb arrangement 11 as schematically indicated in FIG. 5 by plural field lines. The field configuration is approximately that of a plurality of quadrupole fields disposed along the central axis 15 adjacent to each other with respective axes of symmetry 17 spaced apart from each other.

The rods 35 and fingers 37 are preferably made of a material of a high magnetic permeability such as a ferrite material, for example.

Also, it is possible to combine magnetic and electric comb arrangements in one structural arrangement. For example, the fingers 37 may be metal-plated to form electrodes to which adjustable electric voltages can be applied. It is then possible to superimpose electric and magnetic fields in the opening between the two rows of fingers to jointly manipulate beams of charged particles.

Figure 9:
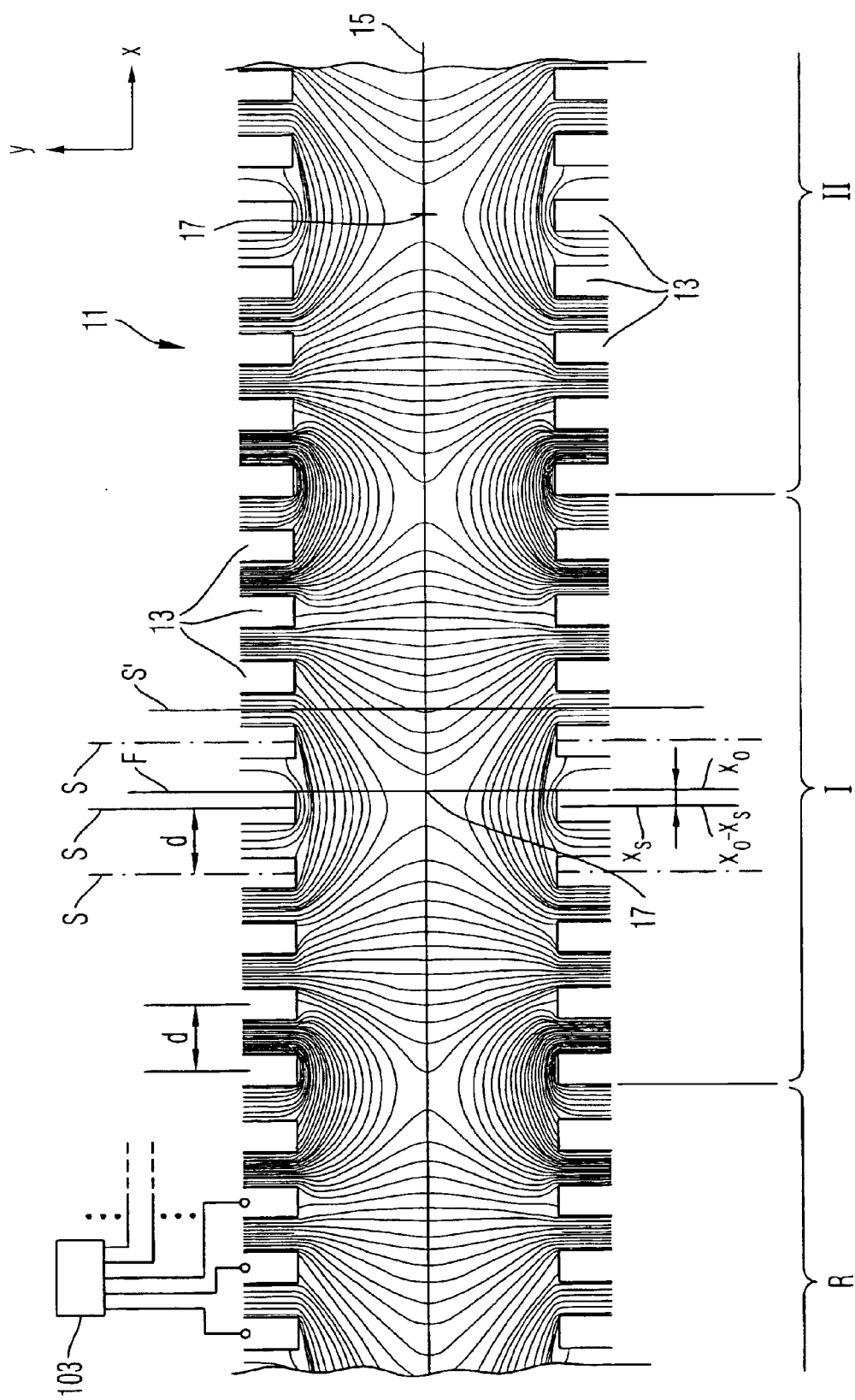
FIG. 9 is a representation of a potential configuration of a comb lens of the microscopy apparatus according to FIG. 8.

FIG. 9 shows a comb electrode 11 having a purality of finger electrodes 13 which are source elements for electric fields. Two field regions I and II are shown in FIG. 9. In each of the field regions I and II a quadrupole-like field is generated, wherein equipotential lines of fields in these field regions are indicated in FIG. 9.

On the right-hand side, next to the field region II which is incompletely shown in FIG. 9, there is provided a further adjoining field region III, also not shown in FIG. 9.

The quadrupole-like field in the left field region I has a field symmetry plane F which is oriented transversely to a longitudinal axis 15 of the comb lens 11. The finger electrodes 13 of the two rows of finger electrodes are respectively disposed opposite from each other, and there exists a set of planes of symmetry S with respect to which the finger electrodes 13 of both rows are symmetrically disposed and which respectively traverse a pair of opposing finger electrodes 13. It is to be noted that in addition to the set of planes of symmetry S shown in FIG. 9 and traversing the finger electrodes 13, a further set of planes of symmetry exists, one of which is designated S' in FIG. 9, by way of example, and which are disposed between adjacent finger electrodes.

The position in the x-direction at which the field symmetry plane F of region I is disposed, can be designated by $x_0$, which represents a displacement of the quadrupole-like field in the x-direction. $x_s$ now designates the position in the x-direction at which the plane of symmetry S of the comb electrodes 11 closest to the field symmetry plane F is disposed. In FIG. 9 this is the plane of symmetry S which is disposed on the left-hand side next to the field symmetry plane F, and which is shown by a continuous line. Further planes of symmetry S shown by dot-dash lines in FIG. 9 are disposed at a higher distance from the field symmetry plane F. The distance between the field symmetry plane. F and the closest plane of symmetry S is designated $(x_0-x_s)$.

The controller 103 is now constructed and programmed to allow the field configuration shown in FIG. 9 to be displaced in the x-direction such that the distance $(x_0-x_s)$ changes.

In the following it will be illustrated according to which methods the voltages to be applied to the finger electrodes 13 are determined in view of achieving a displacement of the field pattern, without, apart from a translation in the x-direction, a considerable change in the configuration of the field lines and equipotential lines, respectively.

FIG. 6a shows a situation in which the distance $x_0-x_s$ is zero. The axis to the right indicates the distance from the field symmetry plane F in the x-direction; and the upwardly oriented axis indicates a voltage V to be applied to the finger electrodes 13.

A continuous function $F_1$ defines the voltage pattern to be applied to the finger electrodes in the situation that $(x_0-x_s)$ equals zero and, for generating a quadrupole field, has a shape of a parabola. When the individual finger electrodes are provided with an index i, the voltages $V_i$ to be applied to the individual finger electrodes may be defined by $$V_i = F_1(x_i - x_0),$$

wherein $x_i$ is a position of the $i^{th}$ finger electrode in row direction. Consequently, the voltage pattern to be applied to the finger electrodes results from a discretization of the continuous function $F_1$. In the situation as shown in FIG. 6a, the finger electrodes are disposed symmetrically with respect to the field symmetry plane F, so that the voltage pattern to be applied to the electrodes is also symmetrical with respect to $x=x_0$.

FIG. 6b shows a situation in which, when compared to FIG. 9, the field symmetry plane F is displaced to the right by an amount which corresponds to one fourth of a distance d between adjacent finger electrodes.

In FIG. 6b, a function $F_m$ is shown which has a same parabolic shape as the function $F_1$ in FIG. 6a. Compared to the function $F_1$ of FIG. 6a, function $F_m$ is displaced by an amount d/4 in the x-direction. The function $F_m$ is a main component of the function $F_1$, which defines the voltages $V_i$ to be applied to the finger electrodes.

In addition, a further correction component $V_c$ is provided for the function $F_1$. $V_C$ is graphically illustrated in FIG. 6c. The function $F_1$ satisfies the formula $$F_1(x) = F_m(x) + F_c(x).$$

It is evident from FIG. 6b, that the voltages $V_2$, $V_3$ and $V_8$ are modified by the influence of the correction components $F_c$ and when compared to the situation in which the voltages are only defined by the main component $F_m$. In FIG. 6b, the potentials of the finger electrodes influenced by the correction component $F_c$ are changed from a value $V_2'$ to a value $V_2$, from a value $V_3'$ to a value $V_3$, and from a value $V_8'$ to a value $V_8$.

The influence of the correction component $F_c$ on the voltage pattern can be understood as follows.

In the situation as shown in FIG. 6a, the voltages $V_i$ applied to the finger electrodes are symmetrical with respect to the field symmetry plane F. $V_4=V_6$, $V_3=V_7$, $V_2=V_8$ and $V_1=V_9$ are fulfilled. This does not hold in FIG. 6b. Here, $V_4 > V_6$, $V_3' > V_7$, $V_2' > V_8'$ and $V_1 > V_9$. Accordingly, a dipole field superimposed on the quadrupole field will be generated by the comb lens 11, when the pattern defined by the function Fm without any further correction functions will be applied to the finger electrodes.

The superposition of the quadrupole field and dipole field, however, is not easily apparent from an illustration of lines of constant potential in the plane of the finger electrodes 13. Also a particle beam which traverses the apparatus along the axis of symmetry 17 of the quadrupole field will not be strongly affected by the superimposed dipole field. It is evident from FIG. 6b, that a difference in the voltages applied to a pair of electrodes which are located symmetrically with respect to the field symmetry plane F and the closest plane of symmetry S, respectively, increases with increasing distance of the pair of electrodes from the planes F and S, respectively. For example, a difference between the voltages $V_4$ and $V_6$ is smaller than a difference between the voltages $V_1$ and $V_9$. Accordingly, contributions of pairs of finger electrodes which are disposed remote from the field symmetry plane F on the dipole effect are greater than those of pairs of finger electrodes which are disposed closer to the plane F. Certainly, however, the dipole effect of the finger electrodes which are disposed remote from the plane F is shielded in the plane of the finger electrodes by the intermediate finger electrodes, what reduces the dipole effect in the plane of the finger electrodes. This is different, though, at some distance away from this plane of the finger electrodes in the z-direction. When seen from a position which is far away from the plane of the finger electrodes in the z-direction, all finger electrodes 13 are spaced apart from each other at approximately the same distance. Consequently, all finger electrodes provide substantially a same contribution to the dipole field at such position distant from the electrodes in the z-direction. The effect of the dipole field increases with increasing distance from the plane of finger electrodes, accordingly.

The correction function $F_c$ is now selected such that correction voltages are applied to only a small number of finger electrodes such that the electrodes to which correction voltages are applied provide a dipole field compensating for the dipole effect illustrated hereinbefore. These finger electrodes are located remote from the plane of symmetry F, so that an influence of these remote electrodes in the plane of the finger electrodes and in the region of the plane of symmetry F is comparatively smaller than at higher distances in the z-direction from the plane of electrodes. Accordingly, the correction function $F_c$ has values of nearly zero for small values of $(x-x_0)$ and, for distances of $x_0$ which are greater than two to three times d, $F_c$ will become different from zero. $F_c$ is chosen to be non-symmetric with respect to $(x-x_0)=0$ for generating the compensating dipole effect.

The magnitude of the correction component depends on the distance $(x_0-x_s)$. No corrections are made when $(x_0-x_s)$ equals zero (see FIG. 6a). The corrections increase with increasing values of $(x_0-x_s)$. In a situation in which the field symmetry plane F is centered between two planes of symmetry S of the comb lens 11, the finger electrodes are again symmetrically arranged with respect to the field symmetry plane F, and the correction voltages will be close to zero again.

A simple method for determining the corrections $F_c$ will now be illustrated with reference to FIG. 7. The function $F_c$ can be expressed as $$F_c(x)=I(x_0-x_s) \cdot A(x).$$

The dependency of function A represents the dependency of the correction function $(x-x_0)$ and is shown in FIG. 6c.

The term I represents a modulation of the correction function $F_c$ and has a dependency as shown in FIG. 7. It is evident therefrom, that when the field is continuously displaced in the x-direction, the corrections have a period which equals the period of the finger electrodes, and the corrections change sign at $(x_0-x_s)=0$. In addition, the exemplary modulation reflected in FIG. 7 illustrates that the amount of the correction term substantially vanishes as $|x_0-x_s|$ approaches zero.

In the embodiment illustrated hereinbefore with reference to FIGS. 6, 7 and 9, a quadrupole field is generated in a region between the finger electrodes, and the quadrupole field is displaced in the x-direction. However, it will be also possible to generate between the finger electrodes field types which are different from the field type of the quadrupole field.

It is possible that the quadrupole field which is to be displaceable in the x-direction is superimposed with another field which is not displaceable in the x-direction. A dipole field would be an example here. In addition to the beam traversing the apparatus being focused, the dipole field will deflect the beam as already explained with reference to FIG. 4. In this case, the voltages to be applied to the finger electrodes can be determined according to the following formula:

$$V_i=F_1(x_i-x_0)+F_2(x_i),$$

wherein $F_1$ represents the field intensity component displaceable in the x-direction as already explained hereinbefore, and $F_2(x)$ represents the stationary field component.

Furthermore, it is possible that the field component which is displaceable in the x-direction need not necessarily have to show the quadrupole symmetry. The displaceable field component may also be of different character. Then, the foregoing contemplations will likewise apply, and a voltage pattern to be applied to the finger electrodes will not only be shifted in the x-direction. Rather, the corrections explained hereinbefore are taken into consideration and their magnitudes are modulated with the distance of a characteristic plane of the field from the closest plane of symmetry of the arrangement of electrodes.

Apart from the dipole effect illustrated hereinbefore which particularly appears at greater distances from the plane of the finger electrodes upon displacement of the field symmetry plane F away from a symmetry plane S of the finger electrodes, deviations of higher order than dipole order will occur. To also compensate for such deviations of higher order, a correcting dipole field as illustrated with reference to FIGS. 6 and 7, in particular FIG. 6c, will not be sufficient. Correcting voltages will then be applied to the finger electrodes such that in addition to the dipole field as illustrated also fields of higher order, such as hexapole fields, will be generated.

Figure 11B:
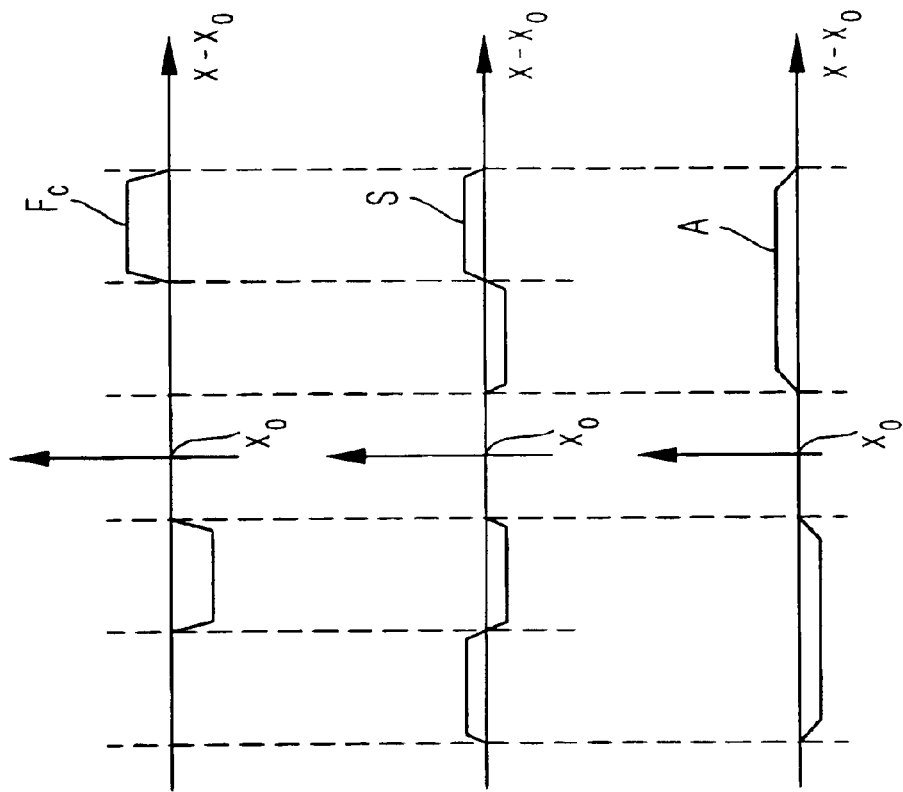
FIGS. 11a and 11b are graphs illustrating further possible correction functions.
Figure 11A:
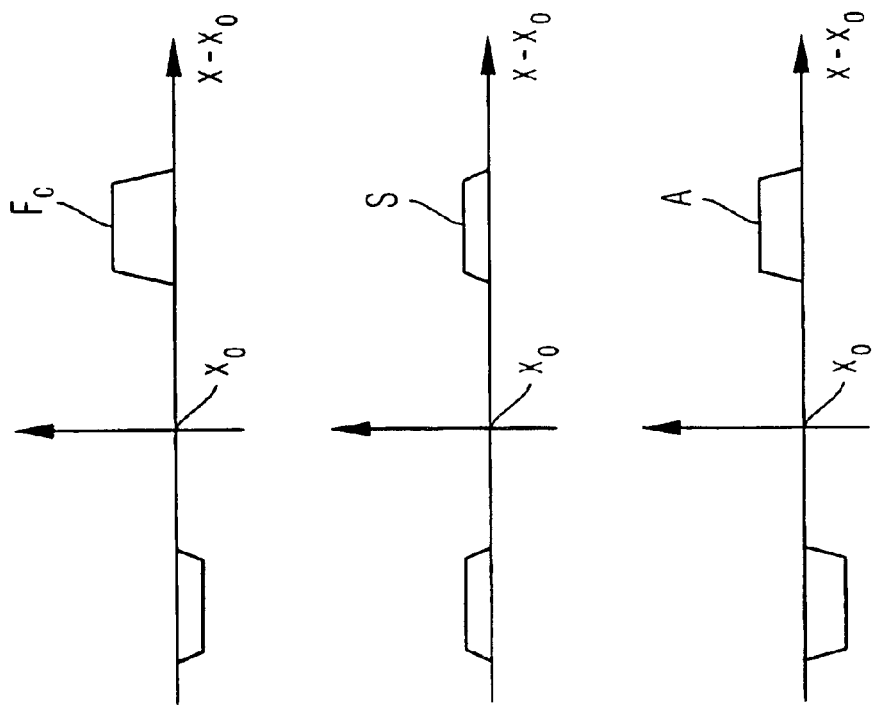

FIG. 11a shows a variant of a modification of the correction function $F_c$ illustrated with reference to FIG. 6c. $F_c$ is now determined in accordance with the equation $$F_c(x)=I_a(x_0-x_s) \cdot A(x)+I_s(x_0-x_s) \cdot S(x)$$

Here, S(x) is a function which is substantially independent of $x_0$ and symmetrical in x, and A(x) is a function which is substantially independent of $x_0$ and asymmetrical in x.

$I_a$ and $I_s$ are corresponding modulations of symmetrical correction function S and asymmetrical correction function A, respectively. Here, modulation $I_a$ has a dependency which is similar to that shown in FIG. 7, i.e., for displacements coincident with a plane of symmetry in which a field source member is disposed, the asymmetrical component of the correction function $F_c$ will vanish.

FIG. 11b shows a further variant of a correction function $F_c$, in which a dipole field is likewise generated at the position $x_0$. However, the dipole field is generated by means of field source members which are spaced apart from $x_0$ at different distances in the row on both sides of $x_0$. Such correcting function $F_c$, can be likewise composed of a symmetrical function S and an asymmetrical function A. In this case too, the modulation for the asymmetrical component A is selected such that the latter vanishes for $(x_0-x_s)=0$.

Hereinbefore, the source strengths of the field source members were analytically determined by calculating the necessary source strengths in a reference system of the field to be generated. As a result, the positions of the individual source members were shifted in the reference system. Certainly, the invention can be also understood by setting the positions of the field source members for the corrections in the reference system to fixed positions and by displacing the fields in such system as it will be illustrated below.

An embodiment can be understood from an example in which the finger electrodes are spaced from each other in a row at a distance of 1 mm, and in which nine finger electrodes at a time are used for generating a displaceable quadrupole field between the rows of finger electrodes.

Figure 12:
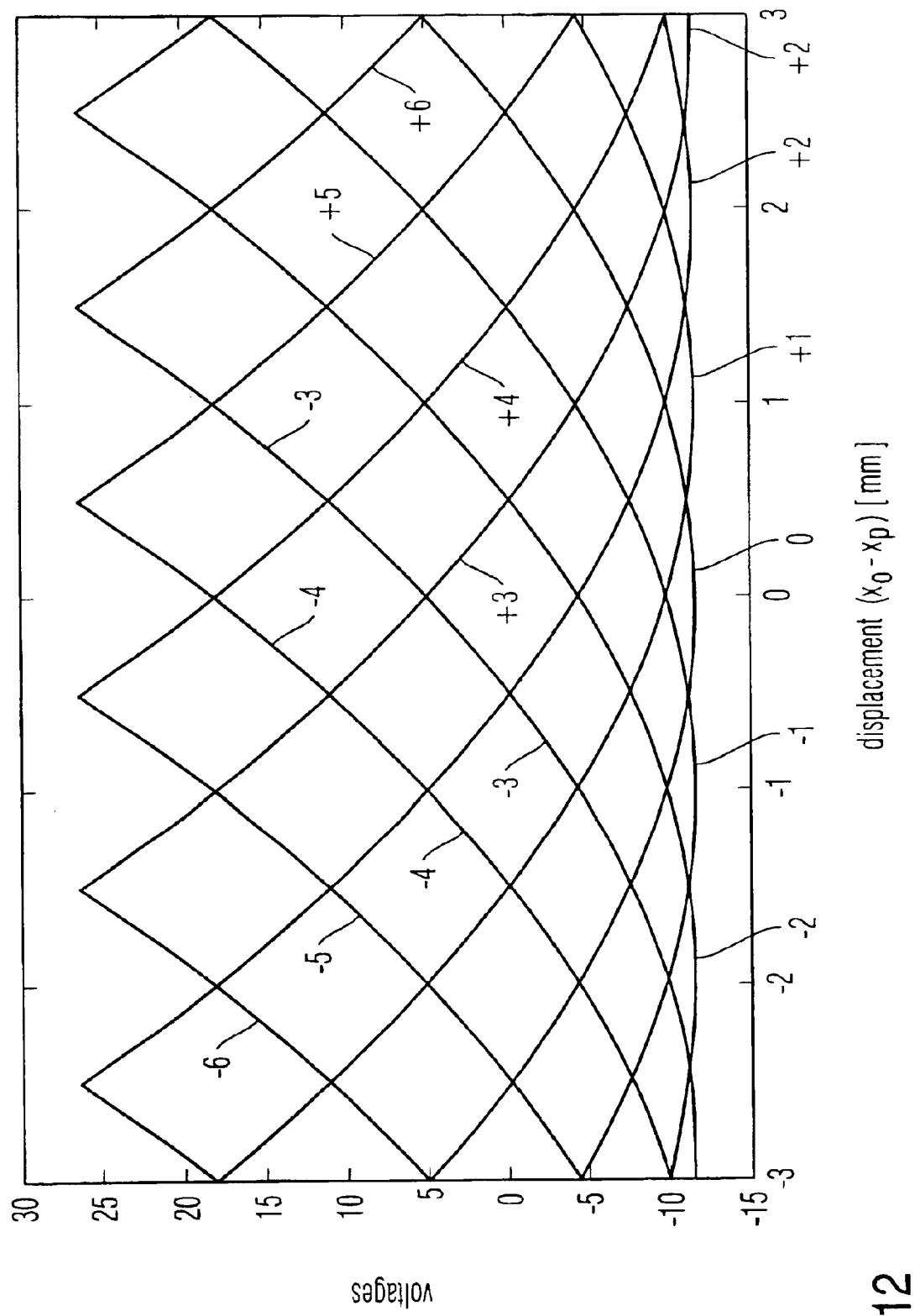
FIG. 12 illustrates graphs of voltages to be applied to finger electrodes in a simple idealized model.

If electric voltages are applied to such configuration of finger electrodes, at first, without taking into account corrections, the voltages will have a dependency on a displacement $(x_0-x_p)$ as shown in FIG. 12. $x_p$ is the origin of the fixed coordinate system and is selected to be coincident with one of the planes of symmetry S (or S') of the row of finger electrodes.

At a displacement value $(x_0-x_p)=0$, in which the axis of symmetry of the quadrupole field coincides with a plane of symmetry S on which a finger electrode is disposed, the voltages to be applied to the electrodes can be read from FIG. 12 as follows.

The index '0' is used for the electrode disposed at $x_p$. The index '+1' is used for the electrode disposed on the right next to the electrode '0', and the index '−1' is used for the electrode disposed on the left next to the electrode '0'. The indices '−2' and '+2', respectively, '−3' and '+3', respectively, and '−4' and '+4', respectively, are used for the electrodes disposed on the left and right of said electrodes '−1', '+1' respectively. At a zero displacement $(x_0-x_p)=0$, the following voltages are applied to the electrodes '−4' to '+4' to generate a quadrupole field having a strength 1.00 V/mm$^2$:

TABLE 1

| electrode | −4 | −3 | −2 | −1 | 0 | +1 | +2 | +3 | +4 |
|---|---|---|---|---|---|---|---|---|---|
| voltage[V] | +18.47 | +5.21 | −4.26 | −9.94 | −11.83 | −11.83 | −4.26 | +5.21 | +18.47 |

These values result from reading the values of ordinate from the graphs with the indices '−4' to '+4', at $(x_0-x_p)=0$ in FIG. 12.

For displacements different from zero, the voltages will be determined according to the same method. In FIG. 12, also voltage curves are shown for electrodes which are located beyond the electrodes '−4' to '+4'.

The curves shown in FIG. 12 have a parabolic shape in dependence of the displacement, what would be ideal for generating a quadrupole field. In fact, however, due to the discretization of the finger electrodes spaced apart from each other at a distance of 1 mm, this ideal quadrupole field is not achieved in reality for displacements that are different from positions of symmetry planes S, as has been explained already hereinbefore. Consequently, correction voltages are applied to selected electrodes, as will be hereinafter further illustrated with reference to FIG. 13. In this example, for displacements $(x_0-x_p)<0.5$ mm, the electrodes '−3' and '+3' are selected for the application of correction voltages. The other electrodes are not corrected.

At a displacement of zero, correction voltages are added to the voltages determined according to FIG. 12. The correction voltage is −0.75 V for each of the electrodes '−3' and '+3'. Consequently, the correction voltages are equal for both electrodes '−3' and '+3'; that is why the electrodes '−3' and '+3' alone do not generate a dipole field. However, such constant portion of the correction voltage of two electrodes '−3' and '+3' serves to compensate for a hexapole field which is in part generated by the symmetrical portion of the correction.

With increasing displacements, the voltage to be applied to the electrode '+3' then becomes more negative, and the voltage to be applied to the electrode '−3' increases. Accordingly, the two electrodes '−3' and '+3' generate a correcting dipole field. For a displacement of 0.5 mm, i.e., a displacement in which the axis of symmetry of the quadrupole field coincides with a symmetry plane of the row, which is disposed between two directly adjacent finger electrodes, the correction voltages to be applied are reduced to zero, so that the correcting dipole field vanishes and the constant portion of the correction vanishes as well. For displacements which are greater than 0.5 mm, the finger electrodes selected for the correction are "switched" to a next pair of electrodes, i.e., the electrodes previously indicated '−2' and '+4' are then selected for the application of the correction voltages. The voltage patterns to be applied to the electrodes '−2' and '+4' for further displacements $(x_0-x_p)$ from 0.5 mm to 1.5 mm are equal to the voltage patterns applied to the electrodes '−3' and '+3' for displacements from −0.5 mm to +0.5 mm. For further increasing displacements above 1.5 mm, the electrodes selected for the correction are switched to a next pair. This also applies for displacements below −0.5 mm.

Figure 13:
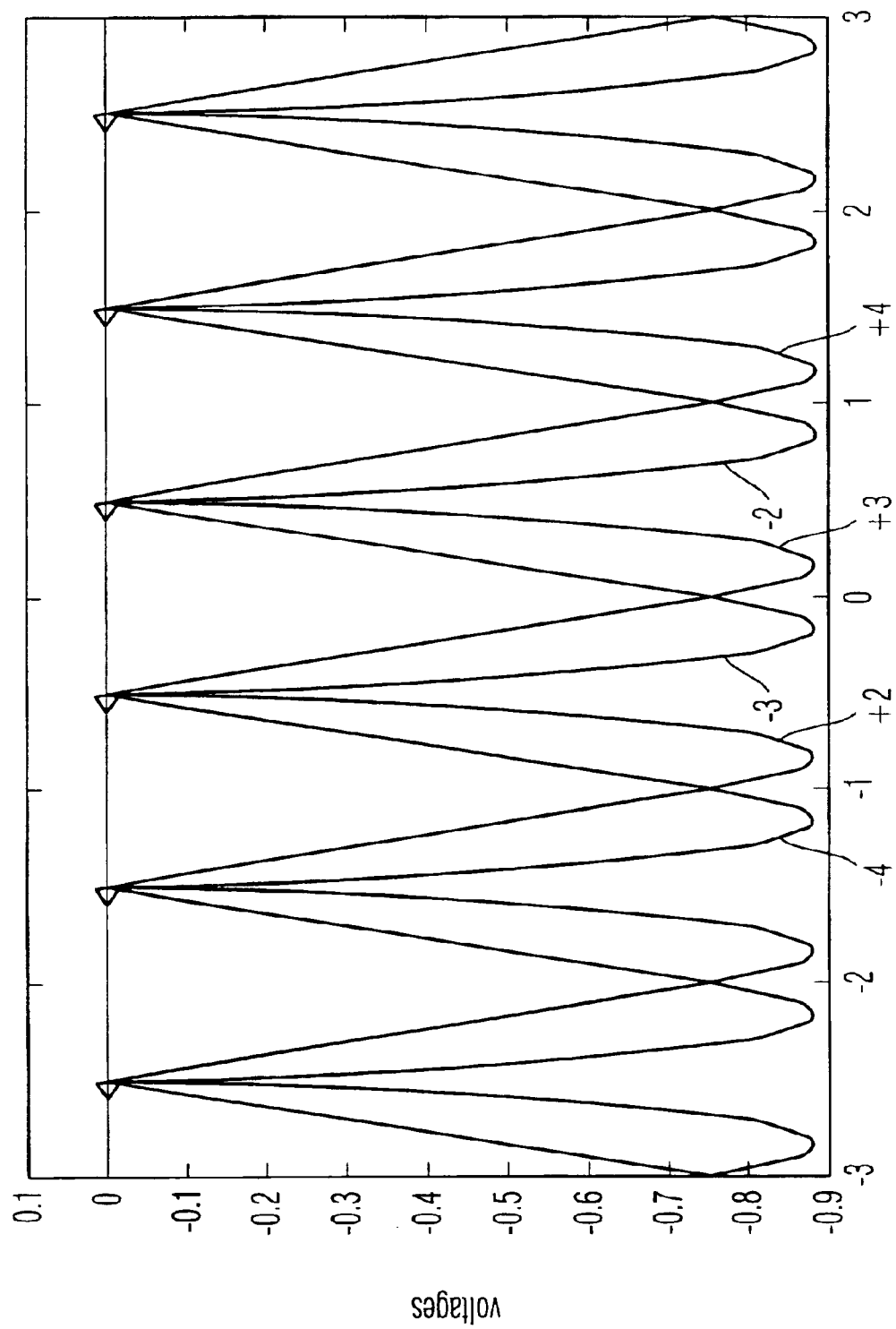
FIG. 13 illustrates graphs of correction voltages with regard to a model advantageous in practice.
Figure 14:
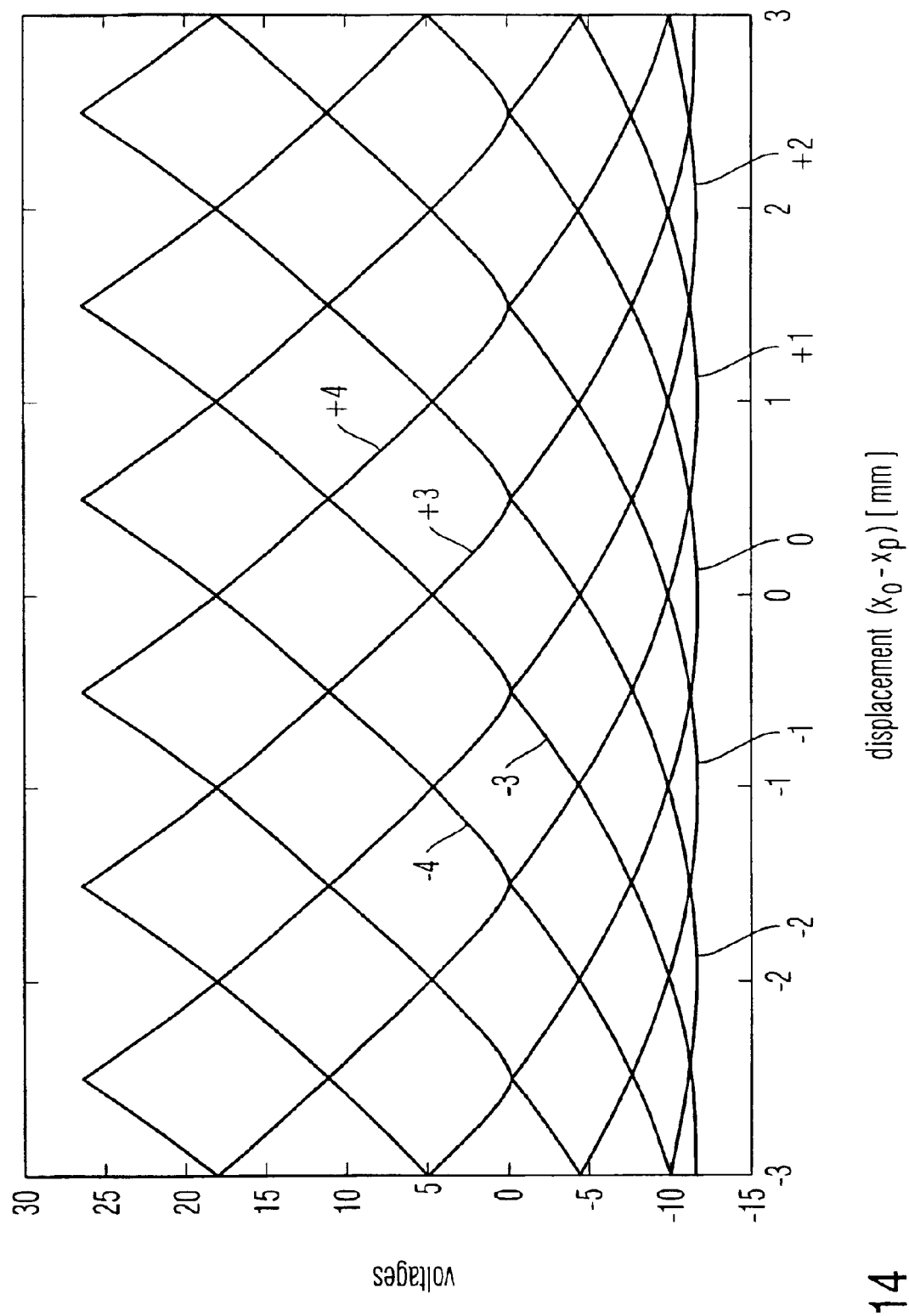
FIG. 14 illustrates graphs corresponding to FIG. 12 of voltages to be applied in the model which is advantageous in practice.

In FIG. 14 the dependencies of the corrected voltages to be applied to the electrodes are illustrated. The corrected voltages result from a sum of the ideal curves according to FIG. 12 and the corrections according to FIG. 13.

In the example according to FIGS. 12, 13 and 14, only two electrodes (electrodes '−3' and '+3') are selected for the application of correction voltages on both sides of a central electrode indicated by '0'. However, it is also possible here to select groups of more than one electrode on both sides of the central electrode.

Figure 8:
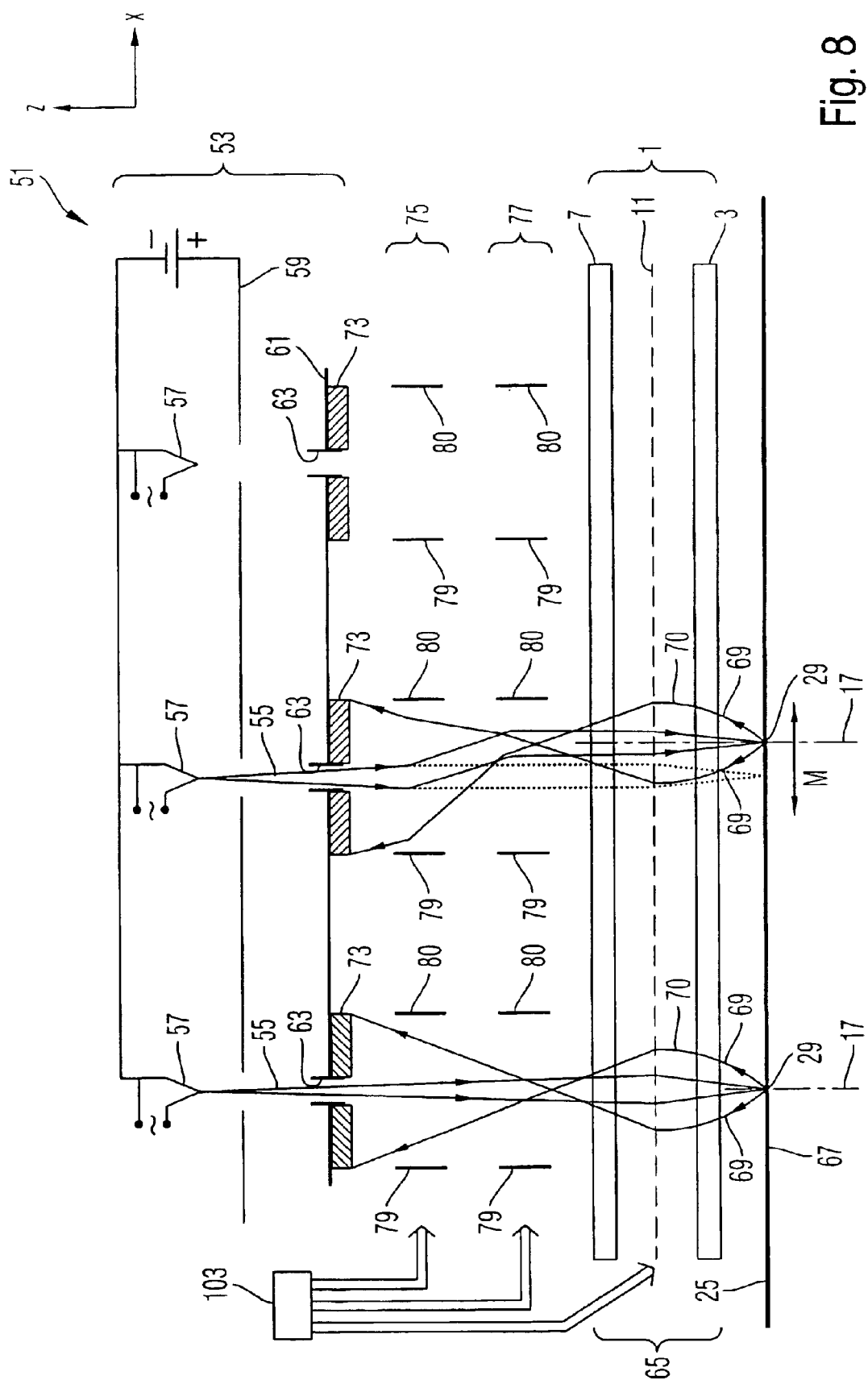
FIG. 8 illustrates an electron microscopy apparatus according to an embodiment of the invention.

An exemplary scanning electron microscopy apparatus 51 according to the present invention is schematically shown in FIG. 8. This apparatus comprises a radiation source arrangement 53 for generating a plurality of primary electron beams 55 having a plurality of glow cathodes 57 for emitting electrons, an anode 59 for extracting the electrons from the cathodes 57 as well as an aperture stop 61 with a plurality of apertures 63 for shaping the plurality of beams 55. In FIG. 8, an arrangement 51 for generating three electron beams 55 is shown. However, it is also possible to provide merely one, two or more than three beams.

The microscopy apparatus 51 further comprises an objective lens arrangement 65 for focusing the primary electron beams 55 in an object plane 25 in which an object to be inspected such as, for example, a semiconductor wafer 67, is disposed. The primary electron beam 55 (probe beam) releases secondary electrons from the object 67. Trajectories of the secondary electrons are shown in FIG. 8 by some exemplary lines 69. The secondary electrons are accelerated by a suitable electric field applied between the objective lens arrangement 65 and the object 67 and shaped to form beams 70 which pass through the objective lens arrangement and impinge on detectors 73 disposed below the aperture stop 61.

Between the detectors 73 and the objective arrangement 65, there are successively disposed a first deflector arrangement 75 and a second deflector arrangement 77. The deflector arrangements 75 and 77 comprise for each primary electron beam 55 a pair of deflection electrodes 79 and 80 to which electric potentials are applied by a controller 103 to generate an electric field between an electrode pairs 79, 80 for deflecting the primary electron beam 55.

In the situation of the beam 55 shown in FIG. 8 on the left, no voltage is applied to the electrodes 79, 80 of both deflector arrangements 75 and 77, so that the deflector arrangements 75 and 77 are traversed straightly by the left primary electron beam 55.

In the situation of the primary electron beam 55 shown in the center of FIG. 8, an electric voltage is applied to the electrodes 79, 80 of the upper deflector arrangement 75 such that the primary electron beam 55 is first deflected by an angle to the right. An opposite voltage is applied to the electrodes 79, 80 of the lower deflector arrangement 77 such that the primary electron beam 55 is deflected by a corresponding angle to the left such that, after having passed through the deflector arrangement 77, the beam extends again parallel to the z-axis towards the objective arrangement 65. Accordingly, the two deflector arrangements 75, 77 generate a parallel displacement of the primary electron beam 55 focused in the object plane 25 so that the object 67 can be scanned with the probe beams.

The objective lens arrangement 65 comprises a comb lens 1 as it has been illustrated with reference to FIGS. 1 to 3. The comb lens comprises an upper slit electrode 7, a lower slit electrode 3 and a comb electrode 11 disposed therebetween. Finger electrodes of the comb electrode 11 are controlled by the controller 103 such that for each of the three primary electron beams 55 electric fields are provided as illustrated in FIG. 9. Each primary electron beam 55 is associated with a separate field region I, II, III. The primary electron beam 55 on the left in FIG. 8 is associated with field region I of FIG. 9, the central beam in FIG. 8 is associated with field region II of FIG. 9, and the beam on the right not shown in FIG. 8 is associated with field region III also not shown in FIG. 9 and explained hereinbefore.

For scanning the object with the primary electron beams, the primary electron beams 55 are commonly displaced in the x-direction by corresponding control of the deflector arrangements 75 and 77, wherein the axes of symmetry 17 of the quadrupole fields are displaced together with the beams.

To maintain the field intensity distribution perceived by each beam as independent as possible from the deflection and the distance $(x_0-x_s)$, respectively, correction terms are taken into account when the voltages to be applied to the finger electrodes 13 are calculated, as has been explained hereinbefore with reference to FIGS. 6 and 7.

Also, the finger electrodes 13 are controlled such that on both sides next to the field regions I, II and III, which are necessary for the focusing of the primary electron beams, additional field regions R can be found, which also provide fields with quadrupole characteristic. Consequently, the field regions I and III, which are disposed at the end of the row of field regions I, II, III are prevented from having a field distribution in character different from the central field region II. Hence, the attempt is made to extend a periodicity of the field regions beyond their end, so that in the field regions disposed at the ends of a row substantially the same conditions prevail as in the centrally disposed field regions.

It is not necessary, however, to provide a complete quadrupole-like field region, as is shown on the left in FIG. 9 by field region R. It is sufficient that a portion of region R next to field region I provides a portion of a quadrupole characteristic.

Figure 15:
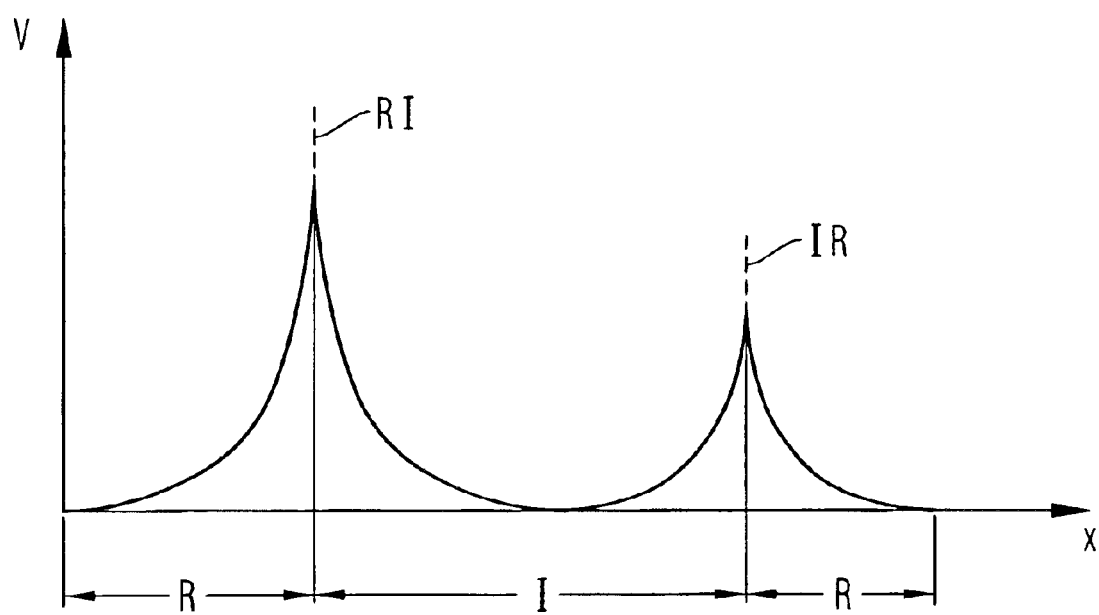
FIG. 15 a further example of a potential configuration along a central axis of a comb lens according to FIG. 9.

As an alternative to the field regions I, II and III used for beam deflection being extended periodically in regions R on the left and on the right of the row of field regions I, II and III, as described hereinbefore, it is also possible to provide in an extension region R a field configuration which extends symmetrically with respect to a field region used for deflecting a beam. This is schematically shown in FIG. 15. In the graph of FIG. 15, the electric potential V is shown in dependence of a position x on the central axis 15 of the comb electrode. A field region I is used for deflecting a beam. The dependence is in the shape of a parabola, on which a straight line is superimposed. This corresponds to a quadrupole field having a dipole field superimposed thereon. At the right end of the region I, there is provided a boundary region R in which the field configuration is in a shape which is mirror-symmetrical with respect to a plane IR, which extends transversely to the x-direction and is disposed at the end of region I. On the left next to region I, there is disposed a further edge region R in which the potential V is extended symmetrically with respect to the potential configuration in region I, i.e., with respect to a plane RI, which is disposed at the left end of region I orthogonally with respect to the x-axis.

As an alternative to the above-described possibilities for compensating dipole field components resulting from fields displaced away from planes of symmetry of the rows, by applying correcting dipole terms to the finger electrodes themselves, it is also possible to provide a corresponding compensating dipole field externally from the comb lens. One possibility is offered, for example, by the beam deflectors 77 with their electrodes 79 and 80 shown in FIG. 8 above the comb lens, which may finally also provide a correcting dipole field.

Alternatively, it is also possible to control the two beam deflectors 75 and 77 such that the beam impinges on the plane of the comb lens at an angle with respect to the orthogonal direction to this plane. A remaining dipole field is then compensated for by the beam undergoing a deflection (see FIG. 4) through said field such that it finally extends orthogonally towards the object plane. As the position 25 is displaced in the x-direction in a continually increasing manner, the angle of incidence of the beam on the comb lens plane then changes periodically about the z-axis.

Furthermore, it is also possible as an alternative, to displace the voltage pattern to be applied to the finger electrodes with respect to $x_0$ to so form a compensating dipole field, producing a result such that a central beam passes through a finally formed field in a region in the comb stop plane in which the field strength vanishes. When the beam 17 passes through the plane of the finger electrodes at $x=x_0$, the voltages to be applied to the electrodes can be determined according to the formula $$V_i = F_m(x_i - x_0 + \delta x(x_0 - x_s)) + F_2(x_i).$$

The term $\delta x$ in the argument of the function $F_m$ thus represents the displacement of the axis of symmetry of the applied voltage pattern relative to the beam axis 17. Here, the term $\delta x$ is zero when $x_0$ and the beam axis, respectively, coincide with an axis of symmetry of the electrodes, and it increases as the distance between $x_0$ and the plane of symmetry increases.

Figure 10:
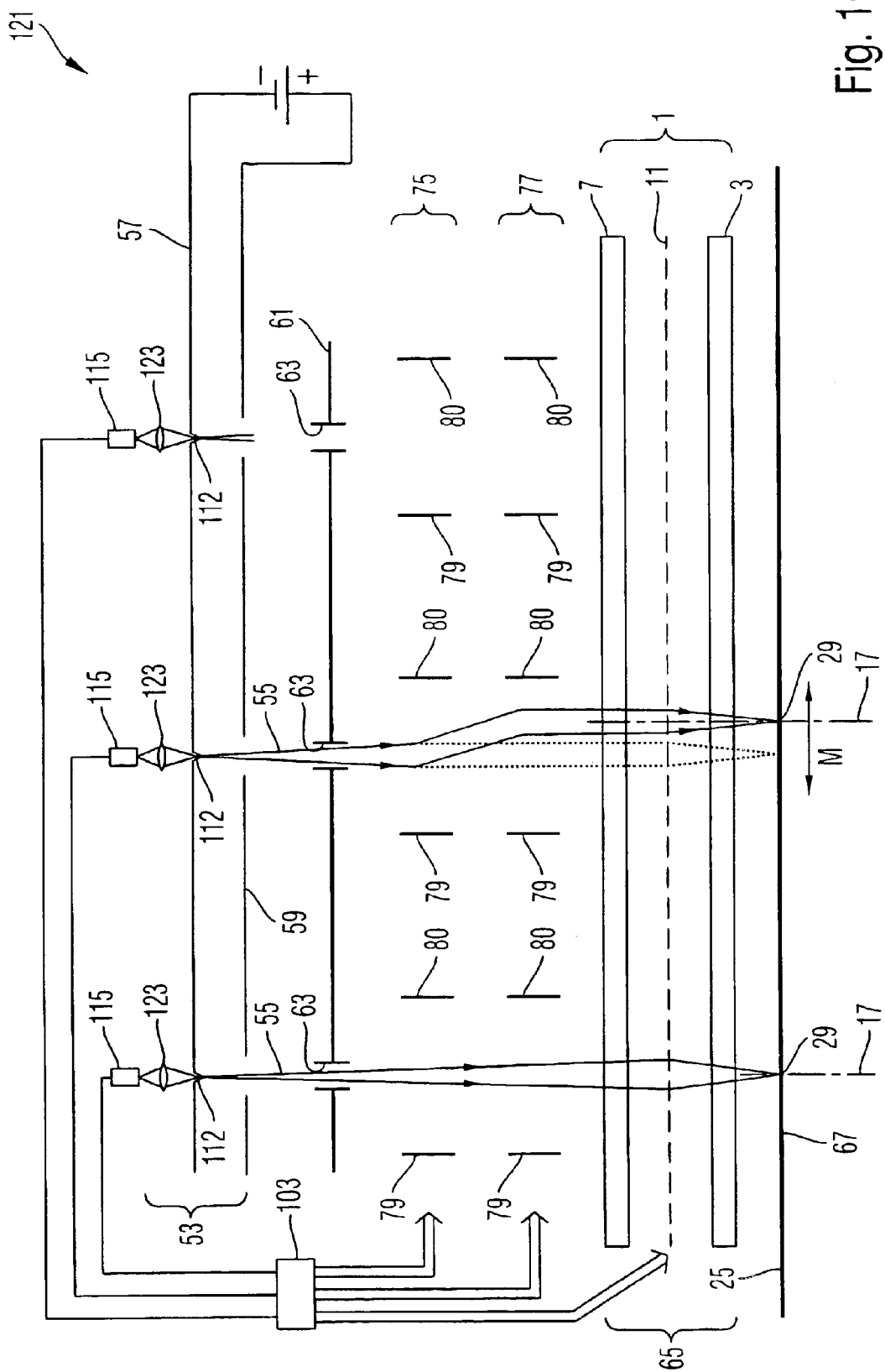
FIG. 10 illustrates an electron lithography apparatus according to one embodiment of the invention.

FIG. 10 schematically shows an exemplary lithography system 121 according to the present invention. Regarding its structure, it is similar to the microscopy apparatus according to FIG. 8. However, the lithography system 121 differs therefrom in respect of the construction of a radiation source arrangement 53. Light emitted by lasers 115 is focused by collimating lenses 123 and directed to projections 112 of an anode plate 57. Electrons are released there by photon-supported field emission in order to generate the primary electron beams 55. Other than the glow cathodes according to FIG. 8, the electron sources can be quickly switched in the lithography system according to FIG. 10, so that the primary electron beams 55 can also be quickly switched on and off.

In an object plane 25, there is disposed a surface of a wafer 67 coated with a resist which is sensitive to particle radiation. The beam deflectors 75 and 77 are controlled by a controller 103 to scan the primary electron beams 55 across the object surface 25 to write a pattern on the particle-sensitive resist. To this end, the lasers 115 are likewise controlled by the controller 103 to switch the beams 55 on and off as required.

In the lithography system 121, the finger electrodes are also controlled such that corrections as described with reference to FIGS. 6 and 7 can be used for determining the potentials to be applied. Furthermore, field regions R (see FIG. 9) are also provided here next to field regions which are assigned to a writing beam in order to reduce boundary effects for writing beams disposed at an end of a row of writing beams.

In the microscopy apparatus described with reference to FIG. 8 and in the lithography apparatus described with reference to FIG. 10, comb electrodes 11 can be respectively used, each of which provides an electric field in the aperture thereof. Alternatively, however, it is also possible, to use comb lenses which provide magnetic fields in apertures thereof, as it has been described with reference to FIG. 5.

In FIGS. 3 and 4 beam paths and field configurations have been depicted in simplified manner to the effect that the fields are schematically limited to an xy-plane and the beams are deflected at sharp angles in this plane and extend straightly outside of the plane. In reality, however, the fields are extended in the z-direction about the plane and, accordingly, the beams will not experience their deflection as bent but as steady curve.

The applications described hereinbefore relate to electron beams, but are not restricted thereto and can also be applied to other kinds of beams of charged particles, such as ion beams or myon beams, for example.

In summary, there is provided an apparatus and a method to manipulate at least one beam of charged particles. The apparatus comprises two rows of field source members 13 which are disposed periodically at a distance from each other such that there exist planes of symmetry S, S' with respect to which the field source members 13 are symmetrically disposed.

The field has a component which is displaceable in the x-direction. To provide such field, a pattern of source strengths according to the formula $F_1(x)=F_m(x)+F_c(x)$ can be applied to the field source members, wherein $F_m$ is a component which is substantially independent of the displacement $x_0$ and $F_c$ is a correction component which is dependent on $x_0$.

The present invention has been described by way of exemplary embodiments to which it is not limited. Variations and modifications will occur to those skilled in the art without departing from the scope of the present invention as recited in the appended claims and equivalents thereof.

What is claimed is:

1. A method for operating a particle-optical apparatus to manipulate at least one beam of charged particles, the apparatus comprising at least one row of field source members extending in a row direction, the field source members being disposed periodically in the row direction and at a distance from each other such that there exists at least one set of symmetry planes such that the field source members of the row are disposed symmetrically with respect to each of the symmetry planes, the method comprising:

setting source strengths of the field source members to generate a field for manipulating the beam such that a field intensity distribution of the field in a region of the field comprises a first intensity component and a second intensity component, wherein the first intensity component is displaceable in the row direction and the second intensity component is substantially independent of a displacement of the first intensity component, wherein the source strengths of the field source members are substantially representable according to a formula $$U_i=F_m(x_i-x_0)+F_2(x_i) \quad (1)$$

wherein $U_i$ is the source strength of an $i^{th}$ field source member, $x_i$ represents a position of the $i^{th}$ field source member in the row direction, $x_0$ represents the displacement of the first intensity component, $F_m(x)$ is a function representing the first intensity component, and $F_2(x)$ is a function representing the second intensity component, and wherein the source strengths of the field source members are further representable by at least one correction term applied to the formula (1), said correction term having an amount which increases in an interval of $|x_0-x_s|$ as $|x_0-x_s|$ increases from zero, wherein $x_s$ represents a position in the row direction of that symmetry plane of the at least one set of symmetry planes which is closest to the position $x_0$.

2. The method according to claim 1, wherein on each of two sides of a field source member next to the position $x_0$ a group of field source members is selected from the field source members of the row, wherein source strengths $U_j'$ of the field source members of each group are determined according to a formula $$U_j'=U_j+C_j(x_0-x_s)$$

wherein $U_j$ is the source strength of a $j^{th}$ field source member of the two groups determined according to formula (1), and $C_j(x)$ represents the correction term for the $j^{th}$ field source member, wherein the correction terms substantially provide a dipole field adjacent to the row at the position $x_0$, and wherein the dipole field increases in an interval of $|x_0-x_s|$ as $|x_0-x_s|$ increases from zero.

3. The method according to claim 2, wherein correction terms are provided which satisfy $C_j(0) \neq 0$.

4. The method according to claim 2, wherein a first symmetry plane of a first set of symmetry planes and a second symmetry plane of the first set of symmetry planes is disposed next to position $x_0$, and wherein a third symmetry plane of a second set of symmetry planes is located between the first and second symmetry planes at a position $x_p$, and wherein the correction terms satisfy $C_j(x_p-x_s)=0$.

5. The method according to claim 2, wherein each group of the two groups of field source members comprises only one field source member.

6. The method according to claim 2, wherein the dipole field substantially vanishes as $|x_0-x_s|$ approaches zero.

7. The method according to claim 1, wherein the function $F_m(x)$ is substantially symmetrical with respect to x=0.

8. The method according to claim 1, wherein the source strengths of the field source members are determined according to a formula $$U_i=F_m(x_i-x_0+\delta x(x_0-x_s))+F_2(x_i) \quad (2)$$

wherein $\delta x(x)$ is the correction term.

9. The method according to claim 1, wherein the beam of charged particles is directed to the field adjacent to the row of field source members such that it passes through a plane of the field source members at a position $x=x_0$.

10. The method according to claim 1, wherein the amount of the correction term substantially vanishes as $|x_0-x_s|$ approaches zero.

11. A method for operating a particle-optical apparatus to manipulate at least one beam of charged particles, the apparatus comprising at least one row of field source members extending in a row direction, the field source members being disposed periodically in the row direction and at a distance from each other such that there exists at least one set of symmetry planes such that the field source members of the row are disposed symmetrically with respect to each of the symmetry planes, the apparatus comprising a beam guiding arrangement for directing the beam of charged particles at a predetermined angle with respect to the row direction to the field at a beam location, or for accepting the beam of charged particles when it emerges at a predetermined angle from the beam location, the method comprising:

setting source strengths of the field source members to generate a field for manipulating the beam such that a field intensity distribution of the field in a region of the field comprises a first intensity component and a second intensity component, wherein the first intensity component is displaceable in the row direction and the second intensity component is substantially independent of a displacement of the first intensity component, wherein the source strengths of the field source members are determined according to a formula $$U_i = F_m(x_i - x_0) + F_2(x_i) \quad (1)$$

wherein $U_i$ is the source strength of an $i^{th}$ field source member, $x_i$ represents a position of the $i^{th}$ field source member in the row direction, $x_0$ represents the displacement of the first intensity component, $F_m(x)$ is a function representing the first intensity component, and $F_2(x)$ is a function representing the second intensity component, and wherein the beam guiding arrangement changes the predetermined angle by a correction term having an amount which increases in an interval of $|x_0 - x_s|$ as $|x_0 - x_s|$ increases from zero, wherein $x_s$ represents a position in the row direction of that symmetry plane of the at least one set of symmetry planes which is closest to the position $x_0$.

12. The method according to claim 9, wherein the amount of the correction term substantially vanishes as $|x_0 - x_s|$ approaches zero.

13. A particle-optical apparatus for manipulating at least one beam of charged particles, the apparatus comprising:

at least one row of field source members extending in a row direction, the field source members being disposed periodically in the row direction and at a distance from each other such that there exists at least one set of symmetry planes such that the field source members of the row are disposed symmetrically with respect to each of the symmetry planes; and a controller for setting source strengths of the field source members to generate a field for manipulating the beam such that a field intensity distribution of the field in a region of the field comprises a first intensity component and a second intensity component, wherein the first intensity component is displaceable in the row direction and the second intensity component is substantially independent of a displacement of the first intensity component, and wherein the controller is configured to set the source strengths of the field source members according to a formula $$U_i = F_1(x_i - x_0) + F_2(x_i) \quad (1)$$

wherein $U_i$ is the source strength of an $i^{th}$ field source member, $x_i$ represents a position of the $i^{th}$ field source member in the row direction, $x_0$ represents the displacement of the first intensity component, $F_1(x)$ is a function representing the first intensity component, and $F_2(x)$ is a function representing the second intensity component, and wherein $F_1(x)$ is given in a region around $x_0$ by $$F_1(x) = F_m(x) + F_c(x),$$

wherein $F_m(x)$ represents a main component which is substantially independent of $x_0$, and $F_c(x)$ represents a correction component which is dependent on $x_0$, and wherein $F_c(x)$ substantially satisfies the equation $$F_c(x) \cong I_a(x_0 - x_s) \cdot A(x) + I_s(x_0 - x_s) \cdot S(x)$$

in an interval of $|x_0 - x_s|$ as $|x_0 - x_s|$ increases from zero wherein $x_s$ represents a position in the row direction of that symmetry plane of the at least one set of symmetry planes which is closest to the position $x_0$, $S(x)$ is a function which is substantially independent of $x_0$ and symmetric in x, $A(x)$ is a function which is substantially independent of $x_0$ and anti-symmetrical in x, $I_s(x)$ is an arbitrary function, and $I_a(x)$ is a function which is zero at $x \cong 0$.

14. The particle-optical apparatus according to claim 13, wherein $F_m(x)$ is symmetric with respect to $x=0$.

15. The particle-optical apparatus according to claim 13, wherein $F_c(x) \cong 0$ is satisfied in a region $|x| < k \cdot d$, wherein d is the distance between adjacent field source members in the row direction and k is an integer number greater than 1.

16. The particle-optical apparatus according to claim 15, wherein $k > 3$.

17. The particle-optical apparatus according to claim 13, wherein each field source member of a first row of field source members extends in a direction oriented transversely to the row direction toward a second row of field source members, and wherein the field source member comprises a front face directed toward the second row.

18. The particle-optical apparatus according to claim 13, wherein each of field source members is a source of electric fields, and wherein the controller is adapted to apply adjustable electric voltages to the field source members.

19. The particle-optical apparatus according to claim 13, wherein each of the field source members is a source of magnetic fields, wherein a plurality of windings are provided in correspondence with the field source members, and wherein the controller is adapted to supply adjustable electric currents to the plurality of windings.

20. The particle-optical apparatus according to claim 13, wherein the row of field source members is disposed between of a pair of shielding apertures for shielding the field in a direction of the beam.

21. The particle-optical apparatus according to claim 13, further comprising:

an electron source for generating a plurality of electron beams; and at least one deflector for deflecting the plurality of electron beams upstream of the at least one row of field source members.

22. The particle-optical apparatus according to claim 21, wherein the electron source is adapted to selectively switch individual electron beams on and off.

23. The particle-optical apparatus according to claim 13, further comprising:
at least one deflector for deflecting a plurality of electron beams downstream of the at least one row of field source members; and
an electron detector for detecting intensities of the electron beams.

24. The apparatus of claim 10, wherein $F_c(x)$ depends upon a value of $|x_0-x_s|$ such that if $|x_0-x_s|>\delta$, then there exist values of x in the region around $x_0$ at which $F_c(x) \neq 0$, wherein $\delta$ is small in comparison with the distance of adjacent field source members in the row direction.

25. A method for operating a particle-optical apparatus to manipulate at least one group of at least one beam of charged particles, wherein the at least one beam of charged particles is incident on the apparatus, the apparatus comprising at least one row of field source members extending in a row direction, the field source members being disposed periodically in the row direction and at a distance from each other, the method comprising:
setting source strengths of the field source members to generate a field for manipulating the at least one beam of charged particles,
wherein a separate field region is provided for each group of the at least one beam of charged particles and wherein a number of the field regions is equal to a number of groups of the at least one beam of charged particles,
wherein an additional field region is provided at at least one end of a row of said field regions, wherein a field in the additional field region is substantially symmetric to the field at the end of the row of field regions, or an intensity of the field in the additional field region changes along the row direction substantially according to a same function as fields in the row of said field regions.

26. The method according to claim 25, wherein the at least one group of at least one beam of charged particles is displaced in the row direction and wherein the field regions are displaced in the row direction synchronised with the beams.

27. A particle-optical apparatus for manipulating at least one group of at least one beam of charged particles, the at least one beam of charged particles being incident on the apparatus, the apparatus comprising:
at least one row of field source members extending in a row direction, the field source members being disposed periodically in the row direction and at a distance from each other; and
a controller which is adapted for setting source strengths of the field source members to generate at least one field region for manipulating the at least one beam of charged particles,
wherein the controller is further adapted for setting the source strengths of the field source members to generate an additional field region at at least one end of a row of field regions, wherein a field in the additional field region is substantially symmetric to a field at the end of the row of field regions, or an intensity of the field in the additional field region changes along the row direction substantially according to a same function as fields in the row of field regions.

28. The particle-optical apparatus according to claim 27, further comprising:
an electron source for generating a plurality of electron beams; and
at least one deflector for deflecting the plurality of electron beams upstream of the at least one row of field source members.

29. The particle-optical apparatus according to claim 28, wherein the electron source is adapted to selectively switch individual electron beams on and off.

30. The particle-optical apparatus according to claim 27, further comprising:
at least one deflector for deflecting a plurality of electron beams downstream of the at least one row of field source members; and
an electron detector for detecting intensities of the electron beams.

* * * * *